United States Patent
Shimamune et al.

(10) Patent No.: US 8,518,785 B2
(45) Date of Patent: Aug. 27, 2013

(54) SEMICONDUCTOR DEVICE AND METHOD OF MANUFACTURING THE SAME

(75) Inventors: Yosuke Shimamune, Kawasaki (JP); Masahiro Fukuda, Kawasaki (JP); Young Suk Kim, Kawasaki (JP); Akira Katakami, Kawasaki (JP); Akiyoshi Hatada, Kawakasi (JP); Naoyoshi Tamura, Kawasaki (JP); Hiroyuki Ohta, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/603,577

(22) Filed: Sep. 5, 2012

(65) Prior Publication Data

US 2012/0329229 A1   Dec. 27, 2012

Related U.S. Application Data

(60) Continuation of application No. 13/240,303, filed on Sep. 22, 2011, now Pat. No. 8,278,177, which is a division of application No. 12/564,313, filed on Sep. 22, 2009, now Pat. No. 8,207,042, which is a division of application No. 11/604,694, filed on Nov. 28, 2006, now Pat. No. 7,626,215.

(30) Foreign Application Priority Data

Jul. 28, 2006   (JP) ................. 2006-206910

(51) Int. Cl.
*H01L 21/336* (2006.01)

(52) U.S. Cl.
USPC .......................... 438/300; 257/190

(58) Field of Classification Search
USPC ................ 438/285, 300; 257/E21.431, 288, 257/190, 18, E29.193, E31.035, E21.441, 257/E21.409
See application file for complete search history.

(56) References Cited

U.S. PATENT DOCUMENTS 6,319,782 B1   11/2001   Nakabayashi
6,566,734 B2   5/2003    Sugihara et al.
(Continued)

FOREIGN PATENT DOCUMENTS

JP   2000-150886 A   5/2000
JP   2005-101278 A   4/2005
(Continued)

OTHER PUBLICATIONS

Chinese Office Action dated Dec. 5, 2008, issued in corresponding Chinese Application No. 200610164669.X, with English translation (14 pages).

(Continued)

*Primary Examiner* — Fernando L Toledo
*Assistant Examiner* — Neil Prasad
(74) *Attorney, Agent, or Firm* — Westerman, Hattori, Daniels & Adrian, LLP

(57) ABSTRACT

A first p-type SiGe mixed crystal layer is formed by an epitaxial growth method in a trench, and a second p-type SiGe mixed crystal layer is formed. On the second SiGe mixed crystal layer, a third p-type SiGe mixed crystal layer is formed. The height of an uppermost surface of the first SiGe mixed crystal layer from the bottom of the trench is lower than the depth of the trench with the surface of the silicon substrate being the standard. The height of an uppermost surface of the second SiGe mixed crystal layer from the bottom of the trench is higher than the depth of the trench with the surface of the silicon substrate being the standard. Ge concentrations in the first and third SiGe mixed crystal layers are lower than a Ge concentration in the second SiGe mixed crystal layer.

8 Claims, 24 Drawing Sheets

(56) References Cited

U.S. PATENT DOCUMENTS

| | | |
|---|---|---|
| 7,172,933 B2 | 2/2007 | Huang et al. |
| 2002/0014659 A1 | 2/2002 | Nakabayashi |
| 2002/0045317 A1 | 4/2002 | Oishi et al. |
| 2005/0029601 A1 | 2/2005 | Chen et al. |
| 2005/0266631 A1 | 12/2005 | Kim et al. |
| 2006/0138398 A1 | 6/2006 | Shimamune et al. |
| 2006/0151776 A1 | 7/2006 | Hatada et al. |
| 2009/0134381 A1 | 5/2009 | Shimamune et al. |
| 2010/0301394 A1 | 12/2010 | Shimamune et al. |

FOREIGN PATENT DOCUMENTS

| | | |
|---|---|---|
| JP | 2006-013428 A | 1/2006 |
| JP | 2006-186240 A | 7/2006 |
| JP | 2007-294780 A | 11/2007 |
| WO | 2005-112577 A2 | 12/2005 |

OTHER PUBLICATIONS

K. Mistry et al., "Delaying Forever: Uniaxial: Uniaxial Strained Silicon Transistors in a 99nm CMOS Technology", 2004, Symposium on VLSI Technology, Digest of Technical Papers, pp. 50-51.

Japanese Office Action dated May 1, 2012, issued in corresponding Japanese Patent Application No. 2006-206910 with a partial English translation.

R. People et al., "Calculation of critical layer thickness versus lattice mismatch for GexSi1-x/Si strained-layer heterostructures", Appl. Phys. Lett.vol. 47(3), 1985., pp. 322-324.

U.S. Office Action dated Dec. 12, 2008, issued in corresponding U.S. Appl. No. 11/604,694.

U.S. Office Action dated Feb. 29, 2012, issued in corresponding U.S. Appl. No. 13/240,303.

RMS=0.266nm

RMS=0.090nm

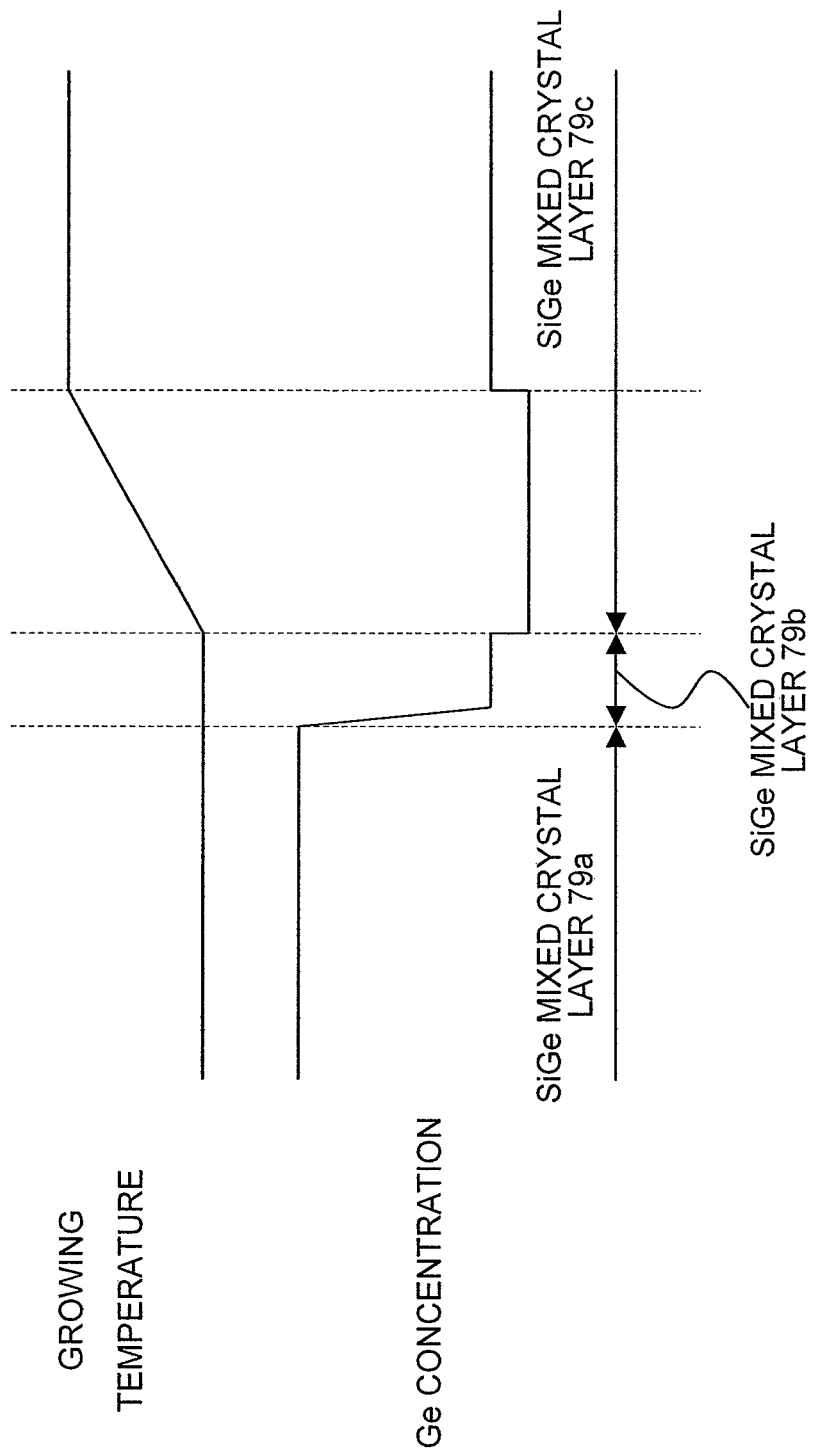

SEMICONDUCTOR DEVICE AND METHOD OF MANUFACTURING THE SAME

CROSS-REFERENCE TO RELATED APPLICATIONS

This application is a continuation application of Ser. No. 13/240,303, filed Sep. 22, 2011, which is a divisional application of Ser. No. 12/564,313, filed Sep. 22, 2009, now U.S. Pat. No. 8,207,042, which is a divisional application of Ser. No. 11/604,694, filed Nov. 28, 2006, now U.S. Pat. No. 7,626,215, which is based on and claims the priority from JP Patent Application No. 2006-206910, filed on Jul. 28, 2006, the entire contents of which are incorporated herein by reference.

BACKGROUND OF THE INVENTION

1. Field of the Invention

The present invention relates to a semiconductor device capable of operating at high speed and a method of manufacturing the same.

2. Description of the Related Art

In an LSI with a transistor or the like of a process rule of 90 nm node and thereafter, a standby off-leak current accompanying miniaturization of elements is not negligible. Therefore, it becomes difficult to improve device performance only by simple miniaturization of a gate length of a transistor, and thus a new approach is needed for improving the device performance.

With such an ultra-miniaturized transistor, the dimension of a channel region located immediately below a gate electrode is very small as compared with conventional transistors. In such a case, it is known that the degree of movement of carriers (electrons and holes) running in the channel region is largely affected by stress applied to the channel region. Accordingly, there are attempted many times to improve the operation speed of a semiconductor device by adjusting such stress.

In general, in a transistor in which a region of its silicon substrate where an impurity is introduced is the channel, the degree of movement of holes is smaller than the degree of movement of electrons. Therefore, improvement of the operation speed of a p-channel MOS transistor using holes as carriers is an important problem when designing a semiconductor integrated circuit device. Then, in the p-channel MOS transistor, it is known that the degree of movement of carriers (holes) improves by applying uniaxial compression stress to the channel region. As a structure for applying the compression stress to the channel region there is proposed one shown in FIG. 18. FIG. 18 is a cross-sectional view showing the structure of a conventional strained silicon transistor.

As shown in FIG. 18, a gate insulating film 202 and a gate electrode 203 are sequentially formed on an n-type silicon substrate 201. In a surface of the silicon substrate 201, impurity diffused layers 207 sandwiching the gate electrode 203 in a plan view are formed. In the impurity diffused layers 207, a p-type impurity is introduced. Further, on sides of the gate electrode 203, side wall insulating films 206 are formed.

In each of the impurity diffused layers 207, a trench 208 is formed so as to match with the side wall insulating film 206, and a SiGe mixed crystal layer 209 is formed therein by an epitaxial growth method. Then, the impurity diffused layer 207 and the SiGe mixed layer 209 constitute a source-drain region. Note that a part of the impurity diffused layer 207 also functions as an extension region. Further, a region of the silicon substrate 201 sandwiched by the source-drain regions functions as the channel region. Therefore, the degree of flow of holes transported from one to the other of the impurity diffused layers 207 via the channel region is controlled by a gate voltage applied to the gate electrode 203.

Further, in this p-channel MOS transistor, the lattice constant of SiGe constituting the SiGe mixed crystal layer 209 is larger than the lattice constant of Si constituting the silicon substrate 201, so that the compression stress in a horizontal direction operates as shown by arrows "a" in the SiGe mixed crystal layer 209. Then, along with this compression stress, as shown by an arrow "b", the SiGe mixed crystal layer 209 is strained in the vertical direction. Furthermore, since the SiGe mixed crystal layer 209 is epitaxially grown relative to the silicon substrate 201, this strain induces a vertical strain as shown by an arrow "c" in the channel region. Then, along with this strain, uniaxial compression stress is induced as shown by arrows "d" in the channel region.

In the conventional p-channel MOS transistor constructed as described above, since such uniaxial compression stress is applied in the channel region, symmetry of Si crystals constituting the channel region changes locally. In other words, a strain is generated in the channel region. Along with such a change of symmetry, degeneracy of the valence band of heavy holes and the valence band of light holes is released, and thus the degree of movement of holes in the channel region increases, thereby improving the operation speed of the transistor. Then, such increase in the degree of movement of holes and improvement in the transistor operation speed accompanying therewith appear significantly particularly in an ultra-miniaturized transistor having a gate length of 100 nm or smaller.

As described above, it has been pointed out in principle that, in a transistor in which the SiGe mixed crystal layer is embedded in the source-drain region, the larger the compression strain generated in the channel region, the more the degree of movement of holes increases (K. Mistry et al., 2004 Symposium on VLSI Technology, Digest of Technical Papers, pp. 50-51). Such increase in compression strain can be realized by increasing a Ge ratio in the epitaxially-grown SiGe mixed layer. However, when the Ge ratio in the epitaxially grown SiGe mixed layer is too high, a lattice mismatch between Si constituting the substrate and SiGe constituting the mixed crystal layer becomes too large, thereby generating dislocation. Such dislocation not only weakens the effect of the compression strain induced by the SiGe mixed crystal layer, but also increases a leak current taking the dislocation as a path. As a result, the transistor performance deteriorates.

In general, dislocation generated in a SiGe mixed crystal layer epitaxially grown on a silicon substrate occurs easier as the Ge ratio is higher or the thickness thereof is larger (R. People et al., Appl. Phys. Lett. Vol. 47(3), 1985). In theory, the limit of a film thickness over which the dislocation occurs is referred to as a critical film thickness, and for epitaxially growing a SiGe mixed crystal layer in which no dislocation exists, it is desirable that the thickness thereof is controlled to be smaller than the critical film thickness. However, when producing transistors in practice, there exist physical damages such as damage due to ion implantation, sputtering damage due to dry etching, and plasma damage in a region (source-drain region) where the SiGe mixed crystal layer is to be formed. Accordingly, even when it is controlled to be smaller than the critical film thickness, there may still occur dislocation in SiGe mixed crystals with these damages being origins.

Therefore, in conventional silicon transistors, in order to assure the normal operation, the Ge concentration is suppressed to be low. In other words, the degree of movement of carriers is suppressed more than necessary.

Further, a wiring is formed on the SiGe mixed crystal layer. Then, in order to make a favorable contact between them, a silicide layer is formed. As such a silicide layer, a Ni silicide layer is used in general in a transistor of 90 nm node or thereafter. However, when the Ni silicide layer is used, as the Ge concentration (Ge ratio) in SiGe mixed crystals becomes higher, its heat stability more easily decreases, and also a $NiSi_2$ phase with high resistivity is more easily formed. The $NiSi_2$ phase has high resistance as compared to a NiSi phase, and easily forms a spike surrounded by {111} planes. Consequently, when the $NiSi_2$ layer exists, current driving performance of the transistor easily deteriorates, and also the leak current easily increases.

Related art is disclosed in Japanese Patent Application Laid-open No. 2006-13428.

SUMMARY OF THE INVENTION

An object of the present invention is to provide a semiconductor device and a method of manufacturing the same capable of raising the degree of movement of carriers while suppressing conventional problems.

In order to solve the above problems, the inventors of the present invention have conducted dedicated studies and consequently reached several aspects of the invention as follows.

A first semiconductor device according to the present invention is provided with a silicon substrate, a gate insulating film formed on the silicon substrate, a gate electrode formed on the gate insulating film, two first conductivity type impurity diffused layers being formed in a surface of the silicon substrate and each having a trench formed in a surface thereof, and two first conductivity type semiconductor layers each epitaxially grown from a bottom of the trench. The impurity diffused layers sandwich the gate electrode in a plan view. A conductivity type of a region of the silicon substrate immediately below the gate insulating film is a second conductivity type. Further, each of the semiconductor layers is provided with a first region including a portion located within or lower than a same plane with an interface between the silicon substrate and the gate insulating film, and a second region located closer to a bottom side of the trench than the first region. The second region has a lattice constant closer to a lattice constant of silicon than a lattice constant of the first region.

A second semiconductor device according to the present invention is provided with a silicon substrate, a gate insulating film formed on the silicon substrate, a gate electrode formed on the gate insulating film, two first conductivity type impurity diffused layers being formed in a surface of the silicon substrate and each having a trench formed in a surface thereof, two first conductivity type semiconductor layers each epitaxially grown from a bottom of the trench, and a silicide layer formed on each of the semiconductor layers. The impurity diffused layers sandwich the gate electrode in a plan view. A conductivity type of a region of the silicon substrate immediately below the gate insulating film is a second conductivity type. Further, each of the semiconductor layers is provided with a fourth region including a portion located within or lower than a same plane with an interface between the silicon substrate and the gate insulating film, and a fifth region in contact with the silicide layer, the fifth region having a lattice constant closer to a lattice constant of silicon than a lattice constant of the fourth region.

In a first method of manufacturing a semiconductor device according to the present invention, a gate insulating film is formed on a silicon substrate, and thereafter a gate electrode is formed on the gate insulating film. Next, two first conductivity type impurity diffused layers are formed in a surface of the silicon substrate. The impurity diffused layers sandwich the gate electrode in a plan view. Then, a trench is formed in a surface of each of the impurity diffused layers. Subsequently, a first conductivity type semiconductor layer is epitaxially grown from a bottom of the trench. A conductivity type of a region of the silicon substrate immediately below the gate insulating film is a second conductivity type. Further, when the semiconductor layer is epitaxially grown, there is formed a first region including a portion located within or lower than a same plane with an interface between the silicon substrate and the gate insulating film. Further, before forming the first region, there is formed a second region closer to a bottom side of the trench than the first region. The second region has a lattice constant closer to a lattice constant of silicon than a lattice constant of the first region.

In a second method of manufacturing a semiconductor device according to the present invention, a gate insulating film is formed on a silicon substrate, and thereafter a gate electrode is formed on the gate insulating film. Next, two first conductivity type impurity diffused layers are formed in a surface of the silicon substrate. The impurity diffused layers sandwich the gate electrode in a plan view. Then, a trench is formed in a surface of each of the impurity diffused layers. Subsequently, a first conductivity type semiconductor layer is epitaxially grown from a bottom of the trench. Thereafter, a silicide layer is formed on the semiconductor layer. A conductivity type of a region of the silicon substrate immediately below the gate insulating film is a second conductivity type. Further, when the semiconductor layer is epitaxially grown, there is formed a fourth region including a portion located within or lower than a same plane with an interface between the silicon substrate and the gate insulating film, and thereafter, there is formed a fifth region in contact with the silicide layer. The fifth region has a lattice constant closer to a lattice constant of silicon than a lattice constant of the fourth region.

It should be noted that in these inventions, the "regions having a lattice constant closer to a lattice constant of silicon" include a "region having a lattice constant completely corresponding to a lattice constant of silicon." Further, each region is not needed to be completely distinguishable from a layer, a film or the like located on another periphery, and may be a portion in a layer for example.

BRIEF DESCRIPTION OF THE DRAWINGS

FIG. 13B is a timing chart showing changes in growing temperatures of SiGe mixed crystal layers and Ge concentrations in the seventh embodiment;

DETAILED DESCRIPTION OF THE PREFERRED EMBODIMENTS

Hereinafter, embodiments of the present invention will be explained specifically with reference to the attached drawings. However, for the sake of convenience, a structure of a semiconductor device is occasionally described together with a method of manufacturing the same.

—First Embodiment—

To begin with, a first embodiment of the present invention is explained. FIG. 1A to FIG. 1F are cross-sectional views showing a method of manufacturing a semiconductor device according to the first embodiment of the present invention in the order of steps.

Figure 1A:
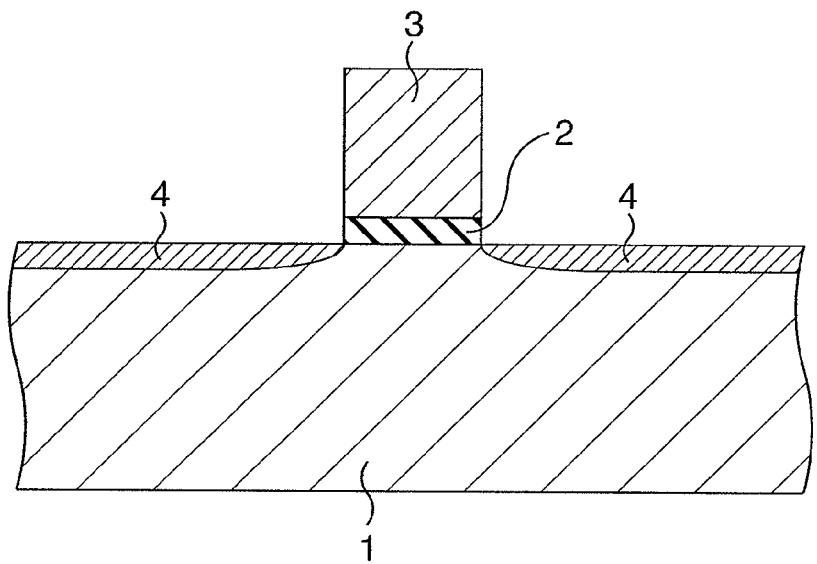
FIG. 1A to FIG. 1F are cross-sectional views showing a method of manufacturing a semiconductor device according to a first embodiment of the present invention in the order of steps.

In this embodiment, first, as shown in FIG. 1A, on an n-type silicon substrate 1 whose surface is a (001) plane for example, a gate insulating film 2 having a thickness of approximately 1.2 nm for example is formed. As the gate insulating film 2, for example a thermally oxidized film or a SiON film is formed. Next, on the gate insulating film 2, a gate electrode 3 constituted of polycrystalline silicon in which a p-type impurity is introduced is formed. Then, with the gate electrode 3 being a mask, a p-type impurity is ion-implanted to thereby form low-concentration impurity diffused layers 4 in the surface of the silicon substrate on both sides of the gate electrode 3 respectively.

Figure 1B:
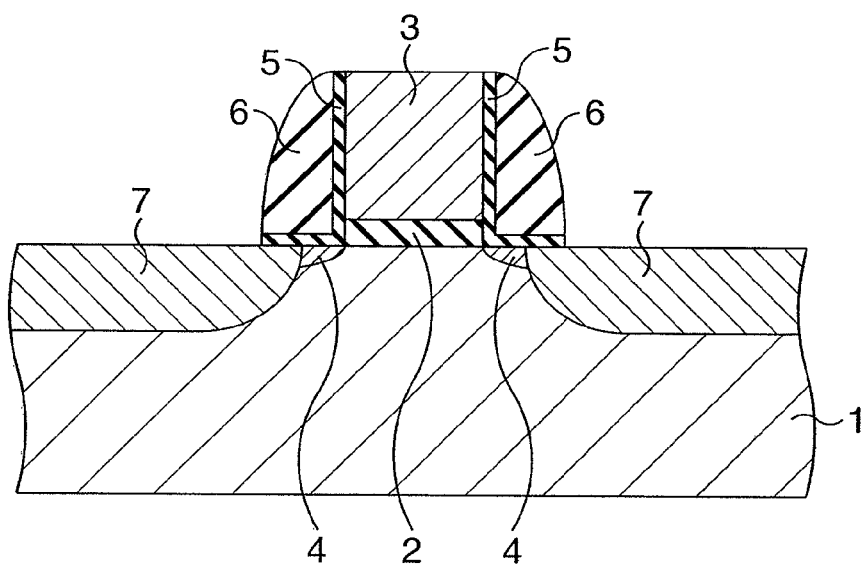

Thereafter, on the whole surface, an oxide film is formed by a CVD method, an insulating film is formed further, and they are etched back to thereby form a CVD oxide film 5 and a side wall insulating film 6 as shown in FIG. 1B. The CVD oxide film 5 cover a part of the surface of the silicon substrate 1 and a side surface of the gate electrode 3. Subsequently, with the gate electrode 3, the CVD oxide films 5 and the side wall insulating films 6 being a mask, a p-type impurity is ion-implanted to thereby form high-concentration impurity diffused layers 7 which overlap parts of the low-concentration impurity diffused layers 4 respectively.

Figure 1C:
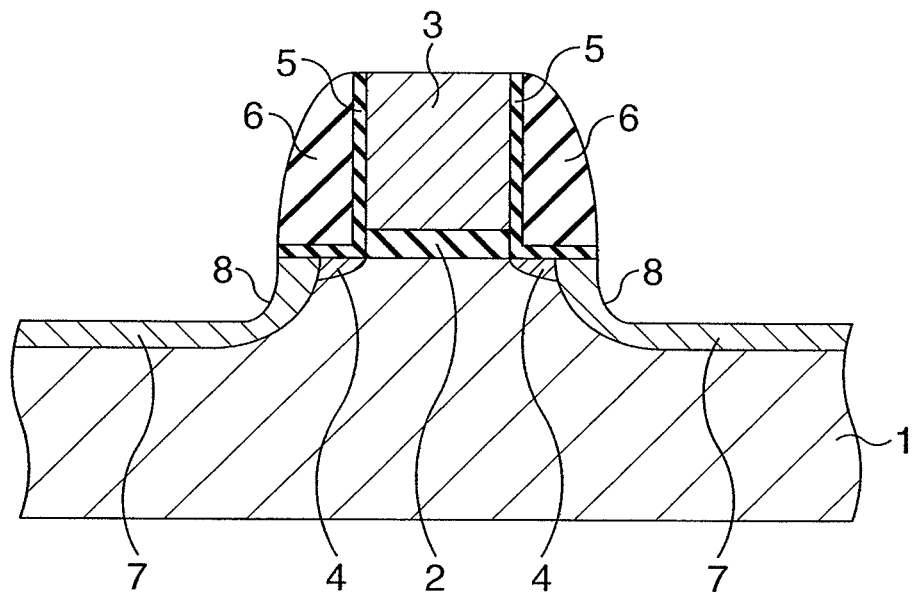

Next, as shown in FIG. 1C, trenches 8 matching with the side wall insulating films 6 are formed in the high-concentration impurity diffused layers 7 respectively.

Figure 1D:
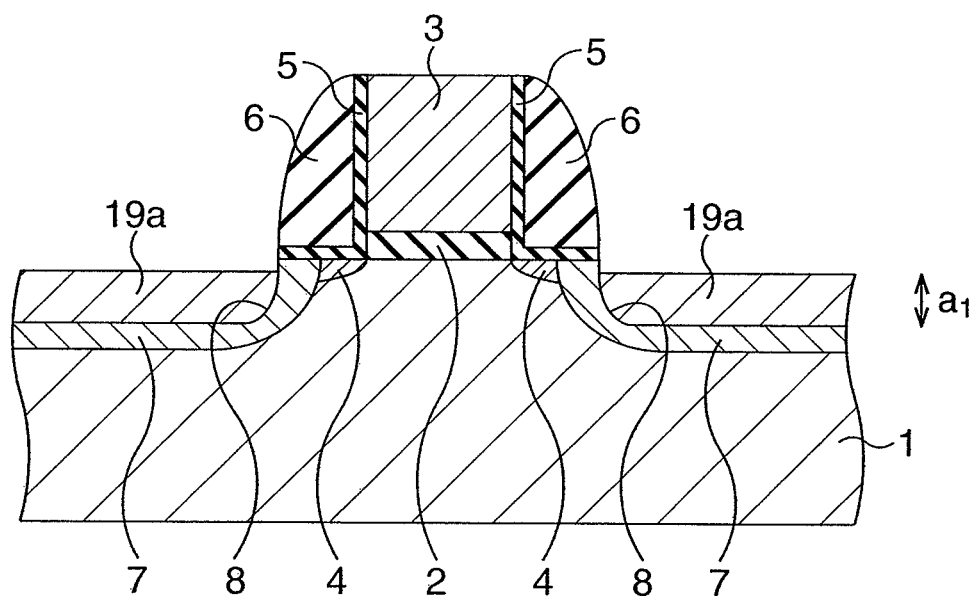

Then, by an epitaxial growth method, as shown in FIG. 1D, a p-type SiGe mixed crystal layer 19a is formed in each of the trenches 8. At this time, the height $a_1$ of an uppermost surface of the SiGe mixed crystal layer 19a from the bottom of the trench 8 is made lower than the depth of the trench 8 with the surface of the silicon substrate 1 being the standard.

Further, a Ge concentration $x_1$ in the SiGe mixed crystal layer 19a is lower than 20 atom % for example. By defining the Ge concentration $x_1$ in the SiGe mixed crystal layer 19a appropriately, a difference (mismatch) in lattice constant between the SiGe mixed crystal layer 19a and the silicon substrate 1 becomes small, which makes occurrence of dislocation with an interface therebetween being the origin difficult.

Figure 1E:
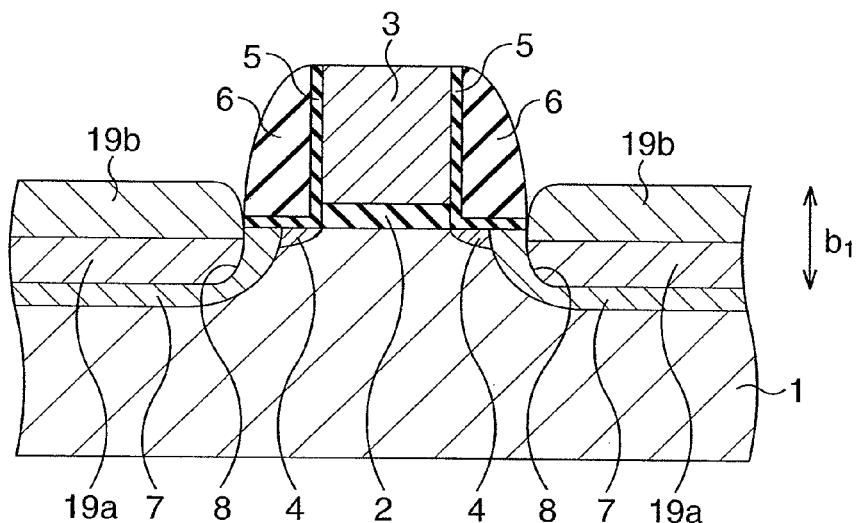

Thereafter, by an epitaxial growth method, as shown in FIG. 1E, a p-type SiGe mixed crystal layer 19b is formed on each of the SiGe mixed crystal layers 19a. At this time, the height $b_1$ of an uppermost surface of the SiGe mixed crystal layer 19b from the bottom of the trench 8 is made higher than the depth of the trench 8 with the surface of the silicon substrate 1 being the standard.

Figure 2:
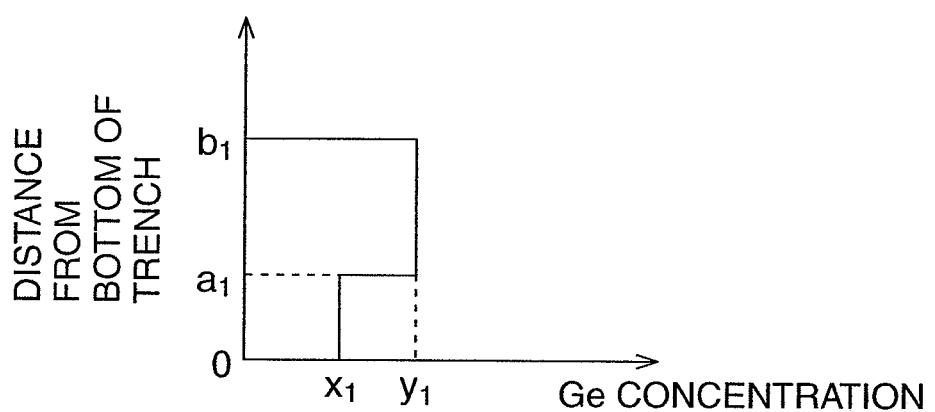
FIG. 2 is a graph showing Ge concentrations in SiGe mixed crystal layers in the first embodiment.

Also, a Ge concentration $y_1$ in the SiGe mixed crystal layer 19b is 20 atom % or higher for example. By appropriately defining the Ge concentration $y_1$ in the SiGe mixed crystal layer 19b, a difference (mismatch) in lattice constant between the SiGe mixed crystal layer 19b and the silicon substrate 1 becomes large, which effectively applies uniaxial compression stress to the channel region. FIG. 2 is a graph showing the Ge concentrations in the SiGe mixed crystal layers in the first embodiment.

Figure 1F:
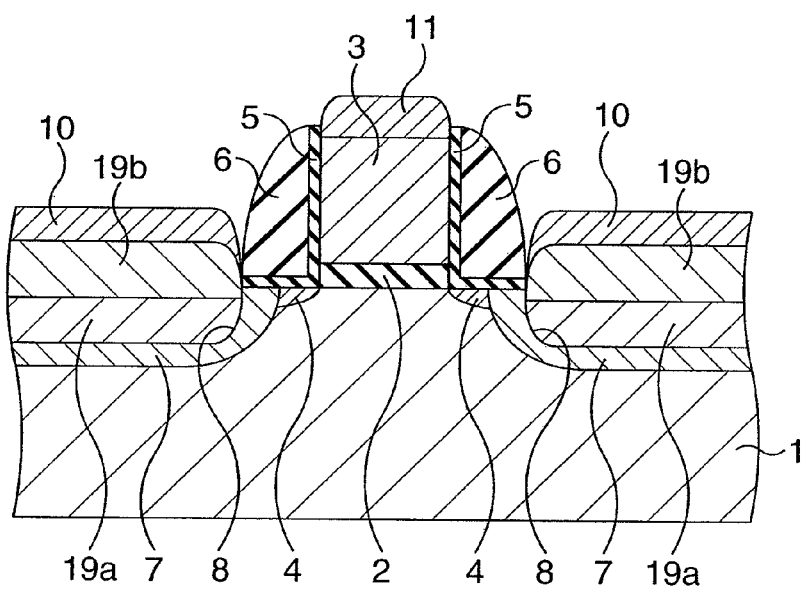

Subsequently, a Ni layer or the like are formed on the entire surface and thermal treatment is performed to thereby form silicide layers 10 on the SiGe mixed crystal layers 19b respectively as shown in FIG. 1F, and also form a silicide layer 11 on the gate electrode 3. Thereafter, an interlayer insulating film, a wiring and so forth are formed to complete the semiconductor device.

Here, a concrete method of selectively forming the p-type SiGe mixed crystal layers 19a and 19b is explained.

First, after the trenches 8 are formed as shown in FIG. 1C, a native oxide film existing on the surface of the silicon substrate 1 is removed. Next, in a pressure-reduced CVD apparatus in which hydrogen gas and inert gas (nitrogen gas, argon gas, helium gas, or the like) are filled and the pressure is kept between 5 Pa and 1330 Pa, the silicon substrate 1 in which the trenches 8 and so forth are formed is introduced, and a substrate temperature is raised to between 400° C. to 550° C. in a hydrogen atmosphere. Then, by retaining the substrate for approximately 60 minutes at the maximum under conditions of pressure: 5 Pa to 1330 Pa and temperature: 400° C. to 550° C., hydrogen baking is performed. Thereafter, while keeping the pressure and the temperature, in the pressure-reduced CVD apparatus, mixed gas of $SiH_4$, $B_2H_6$, HCl and $GeH_4$ is supplied in addition to the hydrogen gas and/or the inert gas described above. $SiH_4$ is source gas for Si, $B_2H_6$ gas is source gas for B (impurity), and $GeH_4$ is source gas for Ge. Further, HCl is gas which improves selectivity of growing direction. Note that the partial pressure of $SiH_4$ is fixed in the range of 1 Pa to 10 Pa, the partial pressure of $B_2H_6$ in the range of $1\times10^{-5}$ Pa to $1\times10^{-3}$ Pa, and the partial pressure of the HCl in the range of 1 Pa to 10 Pa. Further, the partial pressure of the $GeH_4$ gas is selected in the range of 0.1 Pa to 10 Pa according to the Ge concentration in the SiGe mixed crystal layer 19a or 19b that is attempted to be formed. Further, the doping amount of B is approximately $1\times10^{19}$ $cm^{-3}$ to $1\times10^{21}$ $cm^{-3}$.

Such control of the partial pressure of supplied gas can be easily performed by adjusting a supply gas flow rate using a mass flow controller. Therefore, the process of stacking the SiGe mixed crystal layers 19a and 19b can be carried out sequentially in the pressure-reduced CVD apparatus.

In the SiGe mixed crystal layers 19a and 19b formed by the method as described above, B is doped by approximately $1\times10^{19}$ $cm^{-3}$ to $1\times10^{21}$ $cm^{-3}$, which is electrically active almost completely. Therefore, without performing thermal treatment after formation, low resistivity (approximately $1\times10^{-2}$ Ωcm to $1\times10^{-3}$ Ωcm) can be obtained.

According to the first embodiment as described above, since the SiGe mixed crystal layers 19a having the low Ge concentration are epitaxially grown directly on the silicon substrate 1, a difference in lattice constant is small, and thus generation of dislocation is suppressed. Furthermore, on sides of the channel region, the SiGe mixed crystal layers 19b having the high Ge concentration exist instead of the SiGe mixed crystal layers 19a, so that a sufficient strain can be generated to operate adequate stress to the channel region.

Further, when the growing temperature for the SiGe mixed crystal layers is the relatively low temperature of 400° C. to 550° C., HCl in the mixed gas is absorbed on a growing uppermost surface particularly on a side surface of the trench 8 having a high-order of plane direction and dissolved therein, which lowers the growing speed of the SiGe mixed crystal layer. Therefore, the SiGe mixed crystal layers 19a grow from the bottom up in the vertical direction relative to the surface ((001) plane) of the substrate. This means that the SiGe mixed crystal layers 19a hardly grow on a side surface of the trench 8 located between the SiGe mixed crystal layers 19b and the channel region, and therefore it can be said that decrease in stress due to the SiGe mixed crystal layers 19a does not occur at all.

According to the first embodiment as described above, since the SiGe mixed crystal layers 19a having the low Ge concentration are epitaxially grown on the silicon substrate 1, dislocation based on a difference in lattice constant thereof barely exists. Accordingly, problems such as decrease in compression strain and increase in leak current due to the presence of dislocation are suppressed. If the Ge concentration in the entire SiGe mixed crystal layers existing in the trenches 8 is low, an adequate strain cannot be generated in the channel region, but in the first embodiment, since the SiGe mixed crystal layers 19b having the high Ge concentration exist on the SiGe mixed crystal layers 19a, an adequate strain can be generated in the channel region. Specifically, in this embodiment, since the SiGe mixed crystal layers 19b are located instead of the SiGe mixed crystal layers 19a on sides of an uppermost portion of the channel region, which is important for transportation of carriers (holes), a high degree of movement can be assured.

Furthermore, in this embodiment, the SiGe mixed crystal layers 19a and 19b are embedded in the trenches 8 formed in the high-concentration impurity diffused layers 7. In other words, the SiGe mixed crystal layers 19a and lower portions of the SiGe mixed crystal layers 19b are surrounded by the high-concentration impurity diffused layers 7. Accordingly, the p-type SiGe mixed crystal layers 19a having a small band gap and the n-type silicon substrate 1 (n-type well) do not contact directly with each other. Therefore, also generation of a leak current in the pn junction at the Si/SiGe interface is suppressed.

Note that it is preferable that a pocket region exists at a portion of the channel region in contact with the extension region. The pocket region can be formed for example by performing oblique ion implantation of an n-type impurity such as Sb before forming the low-concentration impurity diffused layers 4.

Further, the Ge concentration $x_1$ in the SiGe mixed crystal layers 19a is acceptable as long as it is lower than the Ge concentration $y_1$ in the SiGe mixed crystal layers 19b, and these values are not limited to lower than 20 atom %, and 20 atom % or higher as described above. Also in the following embodiments, Ge concentrations are examples, which are acceptable as long as satisfying a higher-lower relationship of Ge concentration.

—Second Embodiment—

Figure 3A:
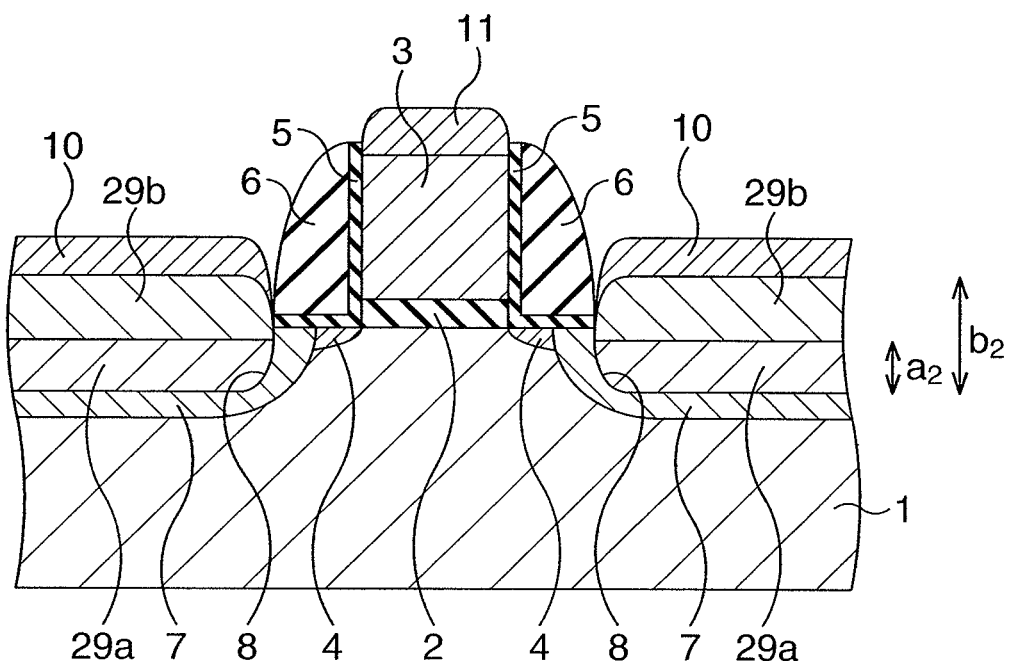
FIG. 3A is a cross-sectional view showing the structure of a semiconductor device according to a second embodiment of the present invention.

Next, a second embodiment of the present invention is explained. FIG. 3A is a cross-sectional view showing the structure of a semiconductor device according to the second embodiment of the present invention.

Figure 3B:
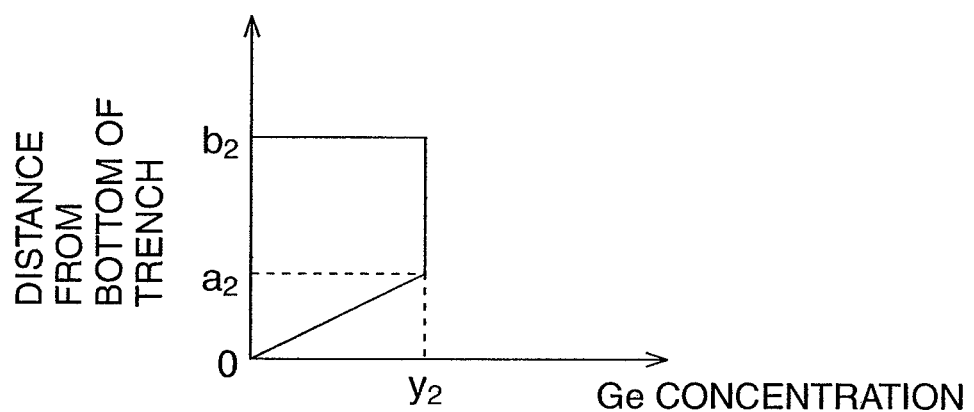
FIG. 3B is a graph showing Ge concentrations in SiGe mixed crystal layers in the second embodiment.

In the second embodiment, a p-type SiGe mixed crystal layer 29a is formed by an epitaxial growth method in each of trenches 8, and a p-type SiGe mixed crystal layer 29b is formed thereon by an epitaxial growth method. Note that the height $a_2$ of an uppermost surface of the SiGe mixed crystal layer 29a from the bottom of the trench 8 is lower than the depth of the trench 8 with the surface of the silicon substrate 1 being the standard. Further, the height $b_2$ of an uppermost surface of the SiGe mixed crystal layer 29b from the bottom of the trench 8 is higher than the depth of the trench 8 with the surface of the silicon substrate 1 being the standard. Furthermore, a Ge concentration in the SiGe mixed crystal layer 29a increases with distance from the bottom of the trench 8, and is $y_2$ at the uppermost surface. Further, the Ge concentration in the SiGe mixed crystal layer 29a is lower than 20 atom % as the whole for example, and the Ge concentration $y_2$ is 20 atom % or higher for example. On the other hand, the Ge concentration in the SiGe mixed crystal layer 29b is $y_2$. The other structure is the same as the first embodiment. FIG. 3B is a graph showing the Ge concentrations in the SiGe mixed crystal layers in the second embodiment.

According to the second embodiment as described above, a discontinuous part of the Ge concentration no longer exists, and thus it is possible to further suppress defects brought about by an abrupt lattice mismatch that occurs at a hetero junction.

Here, a concrete method of forming the p-type SiGe mixed crystal layers 29a and 29b is explained.

First, similarly to the first embodiment, after the trenches 8 are formed as shown in FIG. 1C, a native oxide film existing on the surface of the silicon substrate 1 is removed. Next, in a pressure-reduced CVD apparatus in which hydrogen gas and inert gas (nitrogen gas, argon gas, helium gas, or the like) are filled and the pressure is kept between 5 Pa and 1330 Pa, the silicon substrate 1 in which the trenches 8 and so forth are formed is introduced, and a substrate temperature is raised to between 400° C. to 550° C. in a hydrogen atmosphere. Then, by retaining the substrate for approximately 60 minutes at the maximum under conditions of pressure: 5 Pa to 1330 Pa and temperature: 400° C. to 550° C., hydrogen baking is performed. Thereafter, while keeping the pressure and the temperature, in the pressure-reduced CVD apparatus, mixed gas of $SiH_4$, $B_2H_6$, HCl and $GeH_4$ is supplied in addition to the hydrogen gas and/or the inert gas described above. Note that the partial pressure of $SiH_4$ is fixed in the range of 1 Pa to 10 Pa, the partial pressure of $B_2H_6$ in the range of $1 \times 10^{-5}$ Pa to $1 \times 10^{-3}$ Pa, and the partial pressure of the HCl in the range of 1 Pa to 10 Pa. Further, the partial pressure of $GeH_4$ is increased sequentially from 0 Pa to the range of 0.1 Pa to 10 Pa in proportion to the gas supplying time. By such control of the partial pressure, the SiGe mixed crystal layers 29a are formed. Thereafter, by continuing the film formation with the partial pressure of $GeH_4$ being fixed, the SiGe mixed crystal layers 29b are formed.

Such control of the partial pressure of supplied gas can be easily performed by adjusting a supply gas flow rate using a mass flow controller. Therefore, the process of stacking the SiGe mixed crystal layers 29a and 29b can be carried out sequentially in the pressure-reduced CVD apparatus.

Here, results of measurement of on-currents and off-currents actually performed by the inventors of the present invention with respect to the second embodiment are explained. For measuring the on-currents, three types of samples having different Ge concentrations $y_2$ were made. Further, as a comparative subject for them, a reference sample was also made in which the SiGe mixed crystal layers 29a were not formed and thus all the SiGe mixed crystal layers in the trenches 8 were the SiGe mixed layers 29b. On the other hand, for measuring the off-currents, three types of samples having different Ge concentrations $y_2$ were made. Further, as a comparative subject for them, a reference sample was made in which SiGe mixed crystal layers 29a were not formed and thus all the SiGe mixed crystal layers in the trenches 8 were the SiGe mixed layers 29b.

Figure 4A:
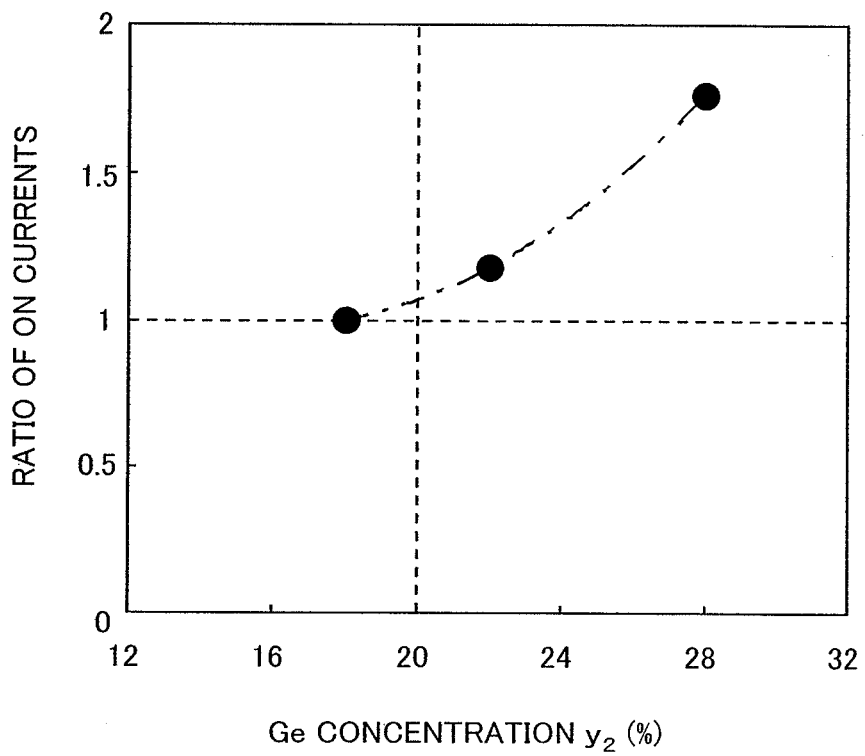
FIG. 4A is a graph showing results of measurement of on-currents.
Figure 4B:
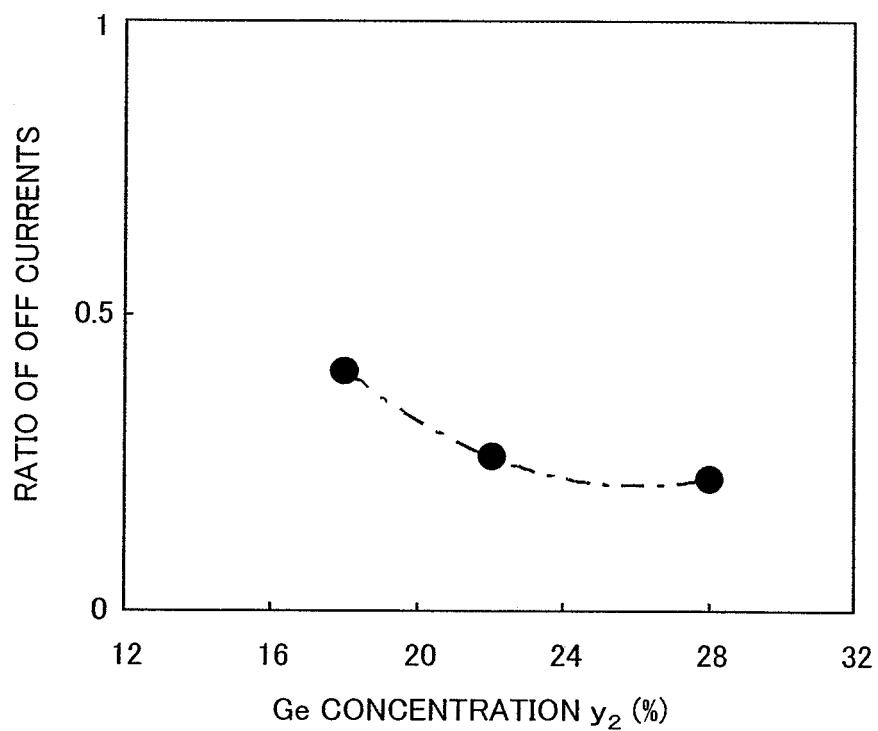
FIG. 4B is a graph showing results of measurement of off-currents.

Results of measurement of the on-currents are shown in FIG. 4A, and the results of measurement of the off-currents are shown in FIG. 4B. Note that the vertical axis in FIG. 4A shows a ratio of the on-currents of the samples with the on-current of the reference sample being the standard. Further, the vertical axis in FIG. 4B shows a ratio of the off-currents of the samples with the off-current of the reference sample being the standard.

As shown in FIG. 4A and FIG. 4B, as the Ge concentration $y_2$ increased, the ratio of the on-currents increased, and also the off-current was reduced. In particular, this effect was significant when the Ge concentration $y_2$ was 20 atom % or higher. This fact shows that a crystal defect such as dislocation easily occurs when just the Ge concentration $y_2$ is high, but with the presence of the strain buffer layers (SiGe mixed crystal layers 29a), occurrence of the dislocation is suppressed, the leak current with the dislocation being a path is suppressed, and also the compression stress provided by the SiGe mixed crystal layers will not be impaired.

—Third Embodiment—

Figure 5A:
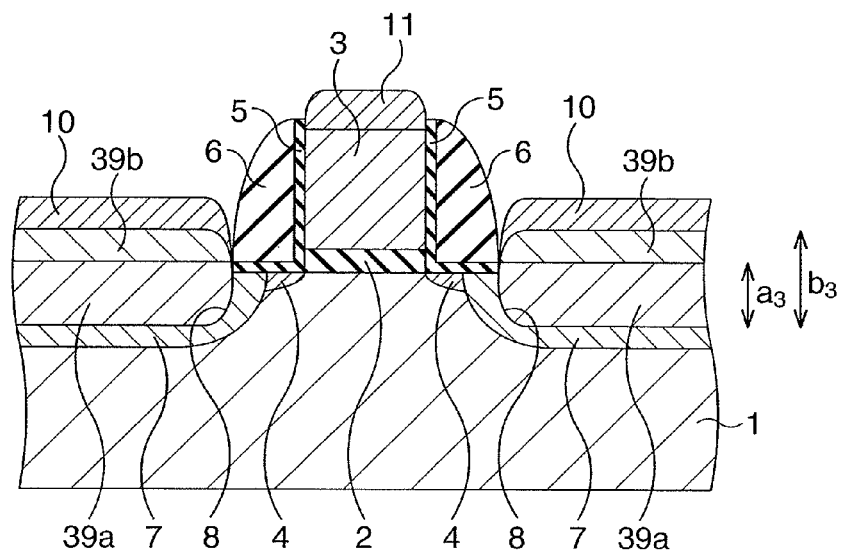
FIG. 5A is a cross-sectional view showing the structure of a semiconductor device according to a third embodiment of the present invention.

Next, a third embodiment of the present invention is explained. FIG. 5A is a cross-sectional view showing the structure of a semiconductor device according to the third embodiment of the present invention.

Figure 5B:
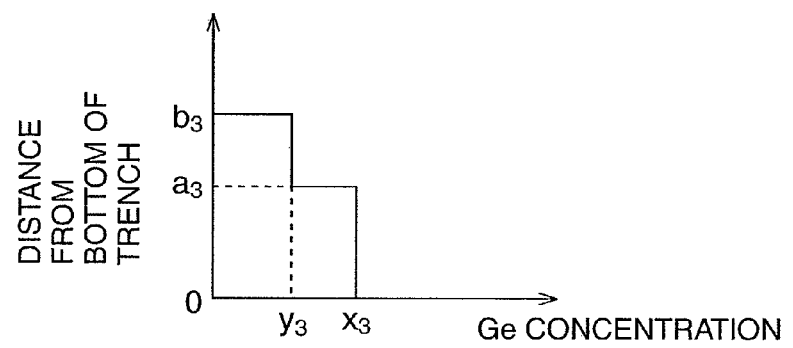
FIG. 5B is a graph showing Ge concentrations in SiGe mixed crystal layers in the third embodiment.

In the third embodiment, a p-type SiGe mixed crystal layer 39a is formed by an epitaxial growth method in each of trenches 8, and a p-type SiGe mixed crystal layer 39b is formed thereon by an epitaxial growth method. Note that the height $a_3$ of an uppermost surface of the SiGe mixed crystal layer 39a from the bottom of the trench 8 is higher than the depth of the trench 8 with the surface of the silicon substrate 1 being the standard. Furthermore, a Ge concentration $x_3$ in the SiGe mixed crystal layer 39a is 20 atom % or higher for example, and a Ge concentration $y_3$ in the SiGe mixed crystal layer 39b is lower than 20 atom % for example. The other structure is the same as the first embodiment. FIG. 5B is a graph showing the Ge concentrations in the SiGe mixed crystal layers in the third embodiment.

According to the third embodiment as described above, since the SiGe mixed crystal layers 39a having the high Ge concentration are located on sides of an uppermost portion of the channel region, which is important for transportation of carriers (holes), a high degree of movement can be assured. Further, between the SiGe mixed crystal layers 39a having the high Ge concentration and the silicide layers 10, the SiGe mixed crystal layers 39b having the low Ge concentration exist, and thus a $NiSi_2$ phase having high resistivity is not formed easily. Therefore, a spike having a (111) plane is not easily formed, and a leak current due to this spike is suppressed. Specifically, according to the third embodiment, sheet resistance in the silicide layers 10 is reduced, and the leak current is reduced.

Note that instead of the SiGe mixed crystal layers 39b having the low Ge concentration, Si layers, which do not include Ge at all, may be used.

Here, results of measurement of sheet resistance in the silicide layers 10 actually performed by the inventors of the present invention with respect to the third embodiment are explained. In this measurement, five samples having different Ge concentrations $y_3$ were made.

Figure 6A:
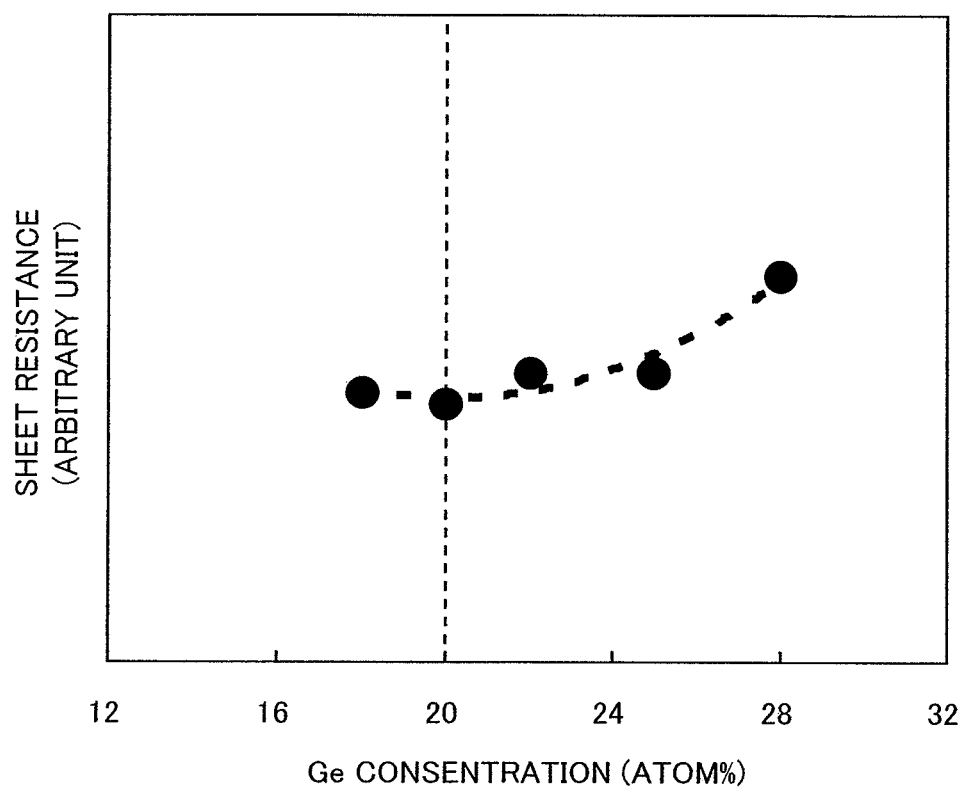
FIG. 6A is a graph showing results of measurement of sheet resistance.

These results are shown in FIG. 6A. As shown in FIG. 6A, as the Ge concentration $y_3$ increased, the sheet resistance increased. In particular, when the Ge concentration $y_3$ was 20% or higher, increase in the sheet resistance was significant. This fact shows that when the Ge concentration $y_3$ is 20% or higher, the $NiSi_2$ phase having higher resistivity as compared to the NiSi phase easily occurs. Therefore, the Ge concentration $y_3$ of the SiGe mixed crystal layer 39a is preferred to be 20% or lower.

Figure 6B:
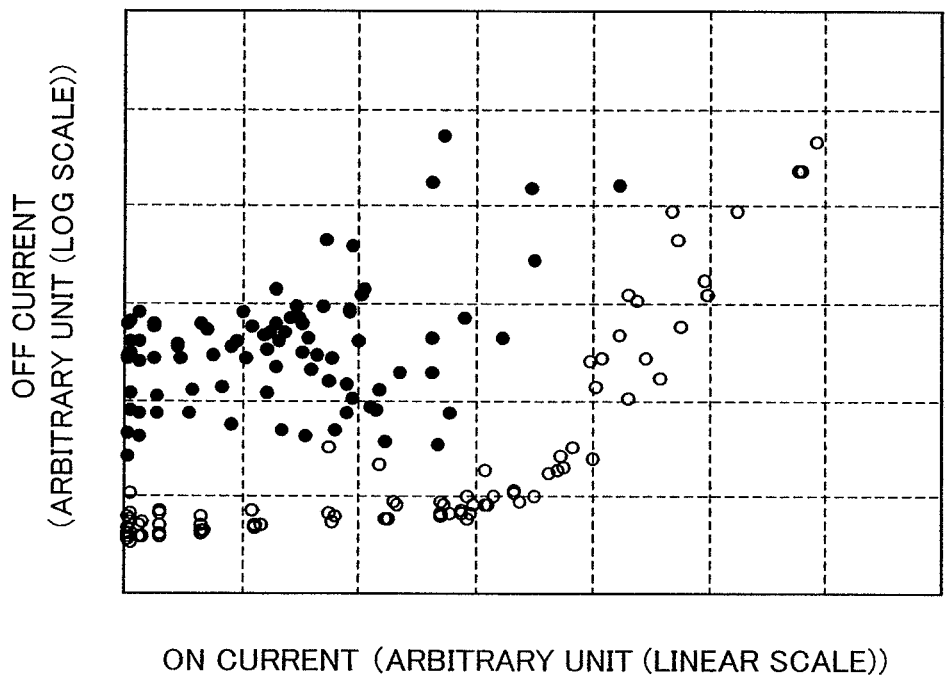
FIG. 6B is a graph showing on-off characteristics of the third embodiment.

Next, results of tests of on-off characteristics performed actually by the inventors of the present invention with respect to the third embodiment are explained. For these tests, a sample was made in which the Ge concentration $x_3$ in the SiGe mixed crystal layers 39a was 28% and the Ge concentration $y_3$ in the SiGe mixed crystal layers 39b was 20%, and an on-current and an off-current thereof were measured. Further, as a comparative subject for them, a reference sample was also made in which the SiGe mixed crystal layers 39b were not formed and thus all the SiGe mixed crystal layers in the trenches 8 were the SiGe mixed layers 39a having a Ge concentration of 28%, and an on-current and an off-current thereof were measured. These results are shown in FIG. 6B. In FIG. 6B, "○" denotes the on-off characteristic of the third embodiment, and "●" denotes the on-off characteristic of the comparative samples.

As shown in FIG. 6B, with the comparative sample, the off-current increased and thus a favorable on-off characteristic was not obtained. This is because the silicide layers 10 were formed directly on the SiGe mixed crystal layers 39a having the Ge concentration of 28%. Specifically, this is because the $NiSi_2$ phase was formed in a spike shape, and thus the junction leak current increased. On the other hand, in the sample of the third embodiment, increase in the off-current was suppressed, and a favorable on-off characteristic was obtained. This means that a normal transistor operation can be assured. This is because the SiGe mixed crystal layers 39b having the Ge concentration of 28% existed on the SiGe mixed crystal layers 39a, and the silicide layer 11 was formed thereabove.

Figure 7A:
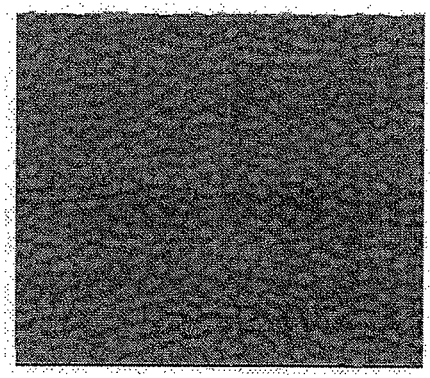
FIG. 7A is a micrograph showing a rough surface of a semiconductor layer.
Figure 7B:
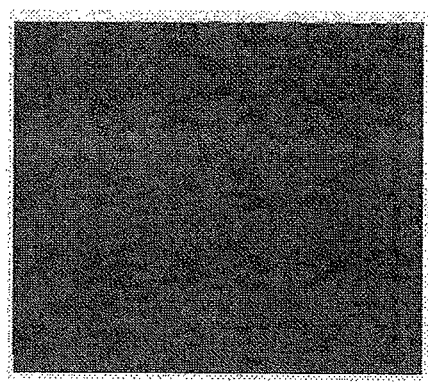
FIG. 7B is a micrograph showing a smooth surface of a semiconductor layer.

Further, the SiGe mixed crystal layer 39a having a Ge concentration of approximately 18 to 20 atom % was formed at 550° C. and with a thickness of approximately 50 nm, and thereafter annealing was performed in a hydrogen atmosphere at 700° C. As a result, the surface of the SiGe mixed crystal layer 39a became rough as shown in FIG. 7A. The surface roughness (RMS) was 0.266 nm. On the other hand, a similar SiGe mixed crystal layer 39a was formed and a Si layer instead of the SiGe mixed crystal layer 39b was formed further with a thickness of approximately 5 nm or smaller, and thereafter the similar annealing was performed. As a result, the surface of the Si layer remained smooth as shown in FIG. 7B. The surface roughness (RMS) thereof was 0.090 nm. This means that the presence of the Si layer improves the stability of the SiGe mixed crystal layer 39a, and thus defects are not easily generated.

Figure 8A:
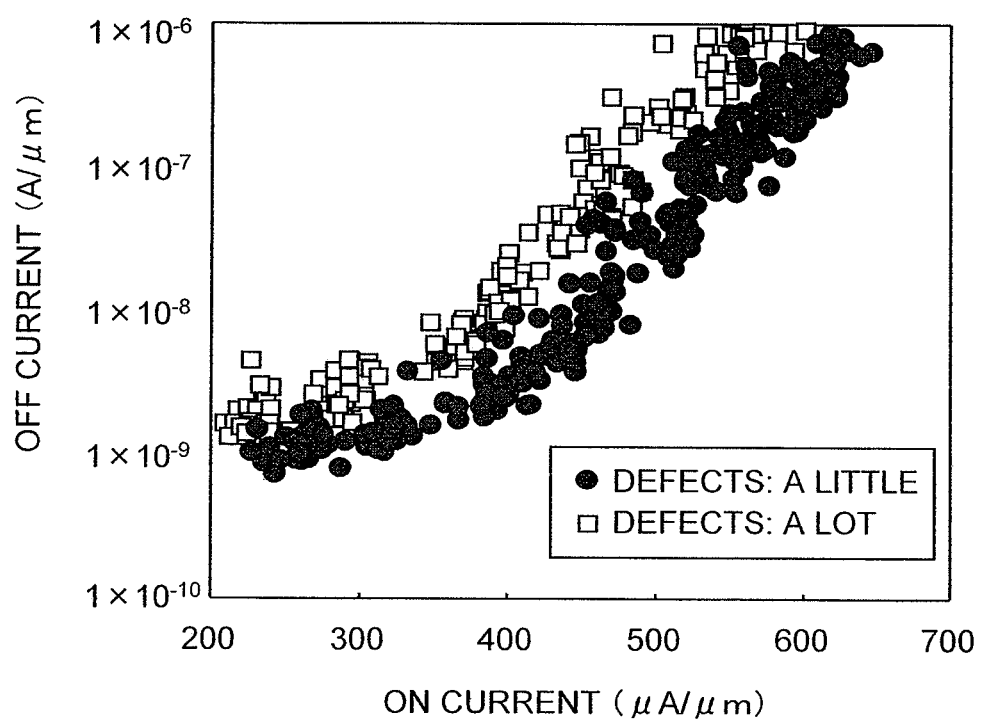
FIG. 8A is a graph showing a relationship between the amount of defects in SiGe mixed crystals and an on-off characteristic.
Figure 8B:
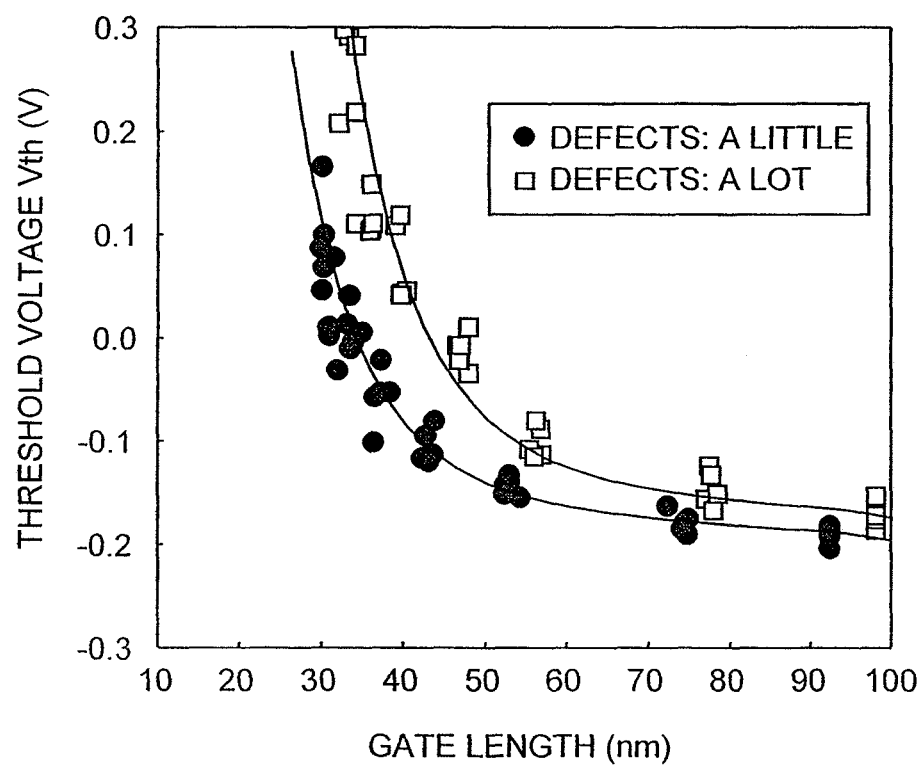
FIG. 8B is a graph showing a relationship between the amount of defects in SiGe mixed crystals and a roll-off characteristic.

FIG. 8A is a graph showing a relationship between the amount of defects in SiGe mixed crystals and an on-off characteristic, and FIG. 8B is a graph showing a relationship between the amount of defects in SiGe mixed crystals and a roll-off characteristic. Note that in FIG. 8A and FIG. 8B, "●" denotes a characteristic when there are a few defects, and "□" shows a characteristic when there are many defects. As shown in FIG. 8A, when there are many defects in the SiGe mixed crystals, the strain in the channel is loosened, and the on-current decreases. Further, as shown in FIG. 8B, when there are many defects in the SiGe mixed crystals, abnormal diffusion is facilitated to reduce the absolute value of a threshold value. On the other hand, when defects in the SiGe mixed crystals can be suppressed low, a favorable on-off characteristic and roll-off characteristic can be obtained.

—Fourth Embodiment—

Figure 9A:
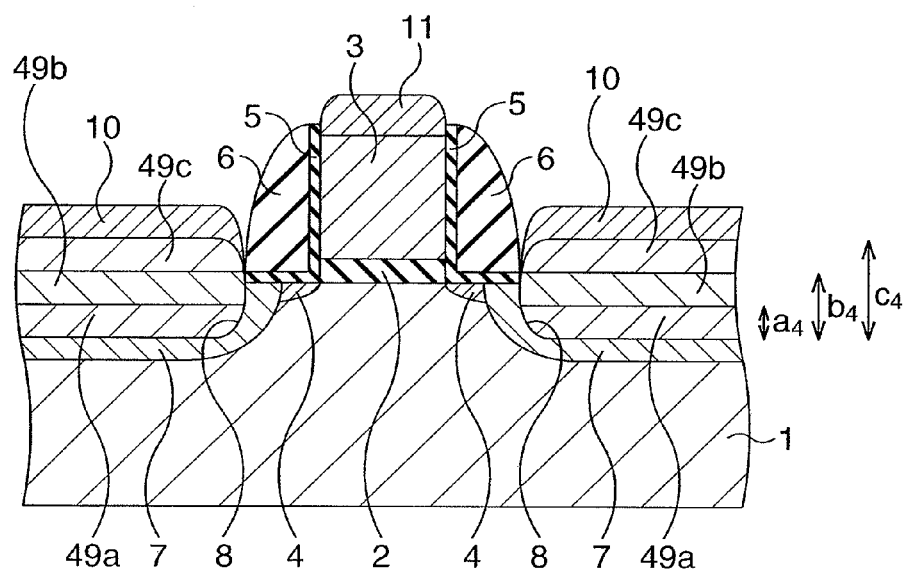
FIG. 9A is a cross-sectional view showing the structure of a semiconductor device according to a fourth embodiment of the present invention.

Next, a fourth embodiment of the present invention is explained. FIG. 9A is a cross-sectional view showing the structure of a semiconductor device according to the fourth embodiment of the present invention.

Figure 9B:
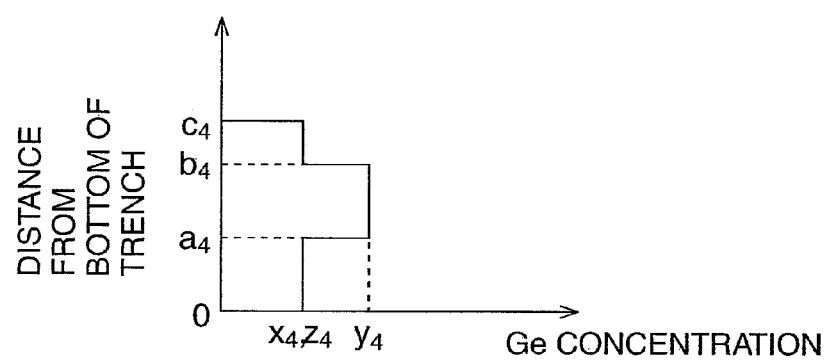
FIG. 9B is a graph showing Ge concentrations in SiGe mixed crystal layers in the fourth embodiment.

In the fourth embodiment, a p-type SiGe mixed crystal layer 49a is formed by an epitaxial growth method in each of trenches 8, and a p-type SiGe mixed crystal layer 49b is formed thereon by an epitaxial growth method. Further, on the SiGe mixed crystal layer 49b, a p-type SiGe mixed crystal layer 49c is formed by an epitaxial growth method. Note that the height $a_4$ of an uppermost surface of the SiGe mixed crystal layer 49a from the bottom of the trench 8 is lower than the depth of the trench 8 with the surface of the silicon substrate 1 being the standard. Further, the height $b_4$ of an uppermost surface of the SiGe mixed crystal layer 49b from the bottom of the trench 8 is higher than the depth of the trench 8 with the surface of the silicon substrate 1 being the standard. Furthermore, a Ge concentration $x_4$ in the SiGe mixed crystal layer 49a is lower than 20 atom % for example, a Ge concentration $y_4$ in the SiGe mixed crystal layer 49b is 20 atom % or higher for example, and a Ge concentration $z_4$ in the SiGe mixed crystal layer 49c is lower than 20 atom % for example. The other structure is the same as the first embodiment. FIG. 9B is a graph showing the Ge concentrations in the SiGe mixed crystal layers in the fourth embodiment. Note that in FIG. 9B, the Ge concentrations $x_4$ and $z_4$ correspond with each other, but they may be different from each other as long as they are lower than the Ge concentration $y_4$.

According to the fourth embodiment as described above, since the SiGe mixed crystal layers 49b having the high Ge concentration are located on sides of an uppermost portion of the channel region, which is important for transportation of carriers (holes), a high degree of movement can be assured. Further, by the SiGe mixed crystal layers 49a, similarly to the first embodiment, problems based on occurrence of dislocation can be suppressed. Furthermore, by the SiGe mixed crystal layers 49c, similarly to the third embodiment, the silicide layers 10 can be formed stably. In other words, the effects of the first and third embodiments can be obtained.

Note that instead of the SiGe mixed crystal layers 49c having the low Ge concentration, Si layers, which do not include Ge at all, may be used.

—Fifth Embodiment—

Figure 10A:
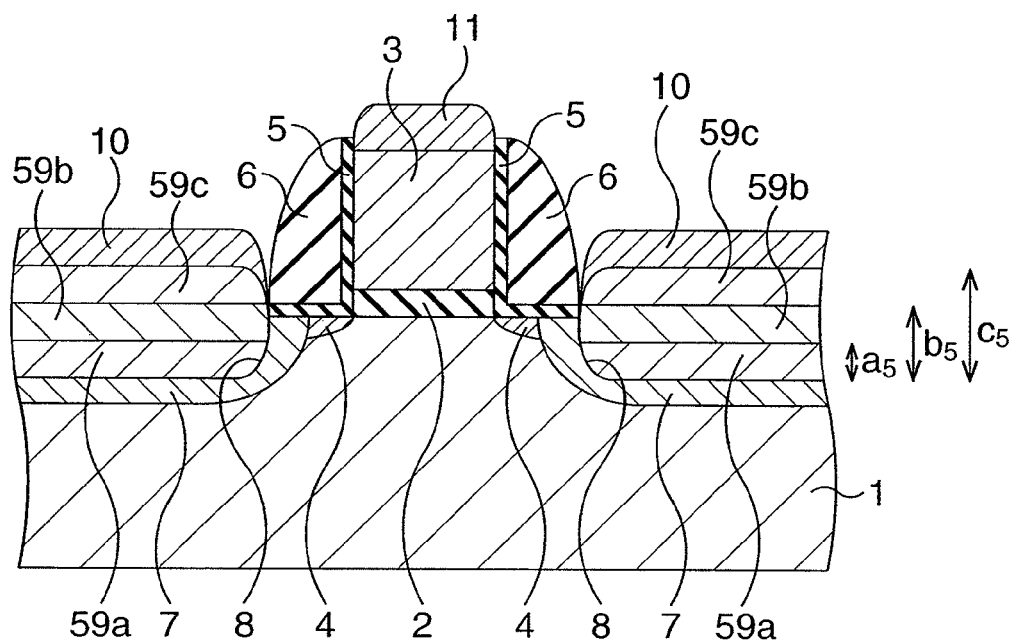
FIG. 10A is a cross-sectional view showing the structure of a semiconductor device according to a fifth embodiment of the present invention.

Next, a fifth embodiment of the present invention is explained. FIG. 10A is a cross-sectional view showing the structure of a semiconductor device according to the fifth embodiment of the present invention.

Figure 10B:
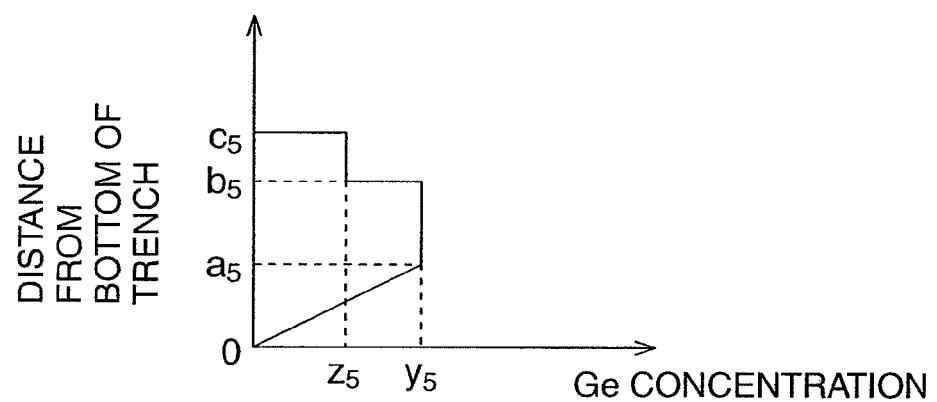
FIG. 10B is a graph showing Ge concentrations in SiGe mixed crystal layers in the fifth embodiment.

In the fifth embodiment, a p-type SiGe mixed crystal layer 59a is formed by an epitaxial growth method in each of trenches 8, and a p-type SiGe mixed crystal layer 59b is formed thereon by an epitaxial growth method. Furthermore, on the SiGe mixed crystal layer 59b, a p-type SiGe mixed crystal layer 59c is formed by an epitaxial growth method. Note that the height $a_5$ of an uppermost surface of the SiGe mixed crystal layer 59a from the bottom of the trench 8 is lower than the depth of the trench 8 with the surface of the silicon substrate 1 being the standard. Further, the height $b_5$ of an uppermost surface of the SiGe mixed crystal layer 59b from the bottom of the trench 8 is higher than the depth of the trench 8 with the surface of the silicon substrate 1 being the standard. Furthermore, a Ge concentration in the SiGe mixed crystal layer 59a increases with distance from the bottom of the trench 8, and is $y_5$ at the uppermost surface. Further, the Ge concentration in the SiGe mixed crystal layer 59a is lower than 20 atom % as the whole for example, and the Ge concentration $y_5$ is 20 atom % or higher for example. Further, a Ge concentration $z_5$ in the SiGe mixed crystal layer 59c is lower than 20 atom % for example. The other structure is the same as the first embodiment. FIG. 10B is a graph showing the Ge concentrations in the SiGe mixed crystal layers in the fifth embodiment.

According to the fifth embodiment as described above, the effects of the second and third embodiments can be obtained.

Figure 11:
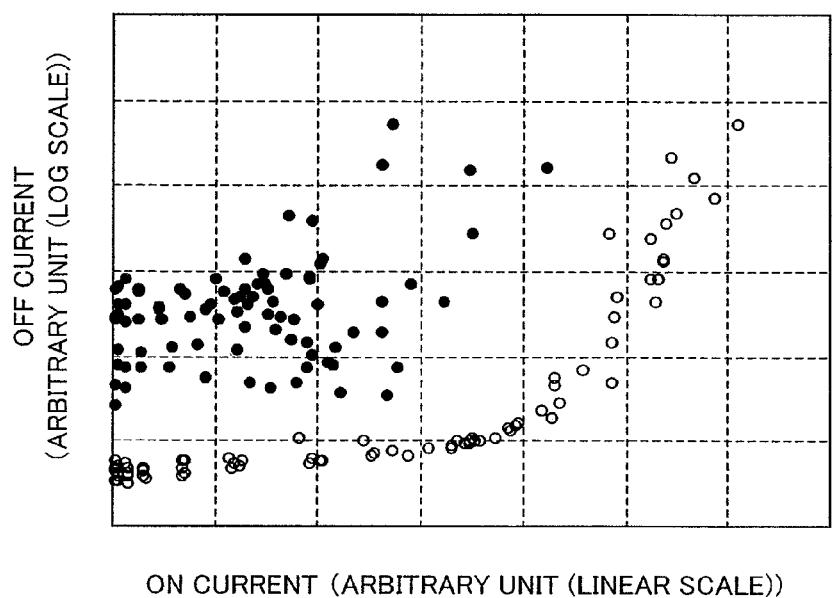
FIG. 11 is a graph showing on-off characteristics of the fifth embodiment.

Here, results of tests of on-off characteristics performed actually by the inventors of the present invention with respect to the fifth embodiment are explained. For these tests, samples were made in which the Ge concentration $y_5$ in the SiGe mixed crystal layer 59b was 28% and the Ge concentration $z_5$ in the SiGe mixed crystal layers 59c was 20%, and an on-current and an off-current thereof were measured. The results thereof are shown in FIG. 11. In FIG. 11, similarly to the tests with respect to the third embodiment, results of comparative samples are also shown. In FIG. 11, denotes "○" the on-off characteristic of the fifth embodiment, and "●" denotes the on-off characteristic of the comparative samples.

As shown in FIG. 11, also in the sample of the fifth embodiment, similarly to the sample of the third embodiment, increase in the off-current was suppressed and a favorable on-off characteristic was obtained as compared to the comparative samples. Furthermore, a more favorable on-off characteristic than that of the sample of the third embodiment was obtained. This is because generation of dislocation was suppressed by the SiGe mixed crystal layers 59a.

Note that instead of the SiGe mixed crystal layers 59c having the low Ge concentration, Si layers, which do not include Ge at all, may be used.

—Sixth Embodiment—

Figure 12A:
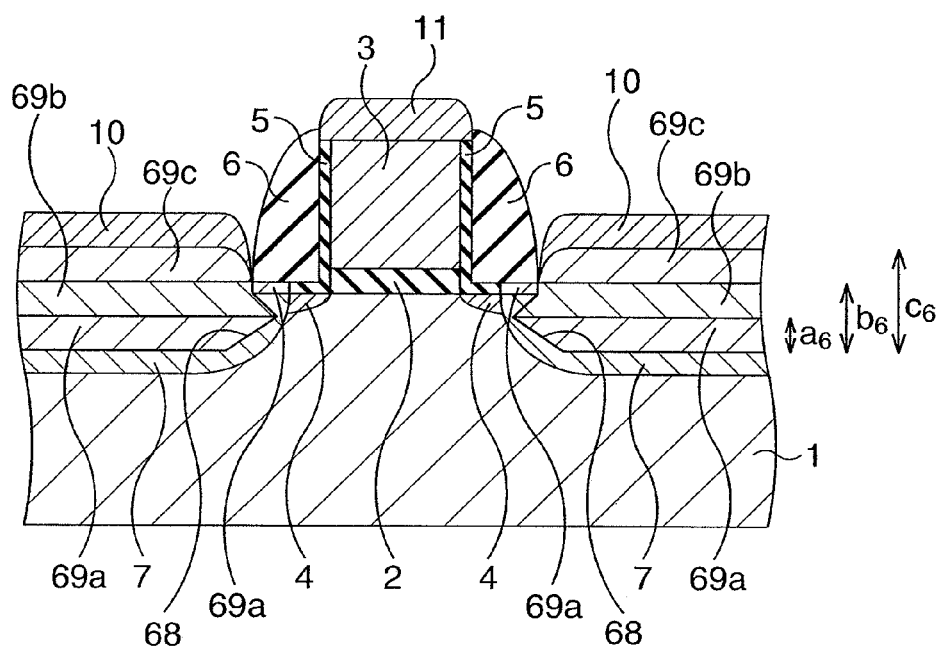
FIG. 12A is a cross-sectional view showing the structure of a semiconductor device according to a sixth embodiment of the present invention.

Next, a sixth embodiment of the present invention is described. FIG. 12A is a cross-sectional view showing the structure of a semiconductor device according to the sixth embodiment of the present invention.

In the sixth embodiment, a trench 68 is formed instead of the trench 8 in each of the high-concentration impurity diffused layers 7. A side surface of the trench 68 on the channel region side is a <111> plane. Such a trench 68 can be formed in a self-aligned manner by wet etching with an organic alkaline solution such as TMAH (Tetra Methyl Ammonium Hydroxide) after forming the trench 8. Further, a side surface of a CVD oxide film 5 is moved back. Such moving back of a side surface can be realized by performing excessive HF processing after forming the trench 68. Note that when the trench 68 is formed by the wet etching, a physically damaged layer due to dry etching and ion implantation existing on a side surface of the trench 8 can be removed, and also flatness thereof can be improved largely.

Figure 12B:
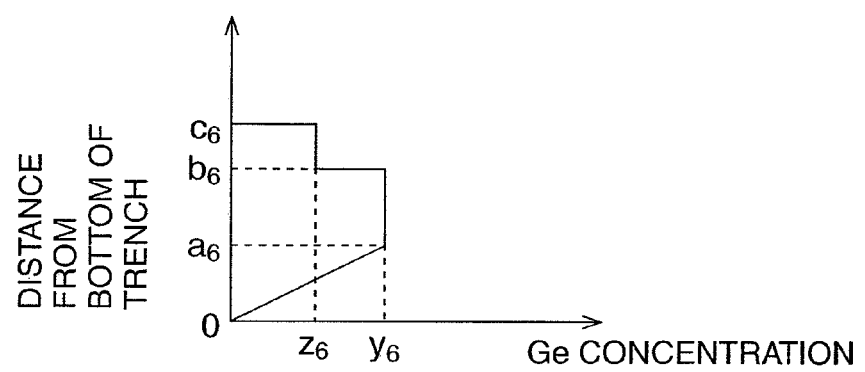
FIG. 12B is a graph showing Ge concentrations in SiGe mixed crystal layers in the sixth embodiment.

Then, a p-type SiGe mixed crystal layer 69a is formed by an epitaxial growth method in the trench 68, and a p-type SiGe mixed crystal layer 69b is formed by an epitaxial growth method thereon. Further, on the SiGe mixed crystal layer 69b, a p-type SiGe mixed crystal layer 69c is formed by an epitaxial growth method. When the SiGe mixed crystal layers 69a to 69c is formed, for example, B having a very high electrical activation rate is introduced as p-type impurity. Note that the height $a_6$ of an uppermost surface of the SiGe mixed crystal layer 69a from the bottom of the trench 8 is lower than the depth of the trench 8 with the surface of the silicon substrate 1 being the standard. Further, the height $b_6$ of an uppermost surface of the SiGe mixed crystal layer 69b from the bottom of the trench 8 is higher than the depth of the trench 8 with the surface of the silicon substrate 1 being the standard. Furthermore, a Ge concentration in the SiGe mixed crystal layer 69a increases with distance from the bottom of the trench 8, and is $y_6$ at the uppermost surface. Further, the Ge concentration in the SiGe mixed crystal layer 69a is lower than 20 atom % as the whole for example, and the Ge concentration $y_6$ is 20 atom % or higher for example. Further, a Ge concentration $z_6$ in the SiGe mixed crystal layer 69c is lower than 20 atom % for example. Furthermore, in this embodiment, in a part where the side surface of the CVD oxide film 5 is moved back, the SiGe mixed crystal layer 69a is formed. The other structure is the same as the first embodiment. FIG. 12B is a graph showing the Ge concentrations in the SiGe mixed crystal layers in the sixth embodiment.

According to the sixth embodiment as described above, the same effects as in the fifth embodiment can be obtained. Further, between the side wall insulating film 6 and the source-drain region, there exists the SiGe mixed crystal layer 69a, in which p-type impurity (B for example) is introduced, and since the resistivity of this portion is low, parasitic resistance in an extension region is low. Further, since it is located higher than the extension region, deterioration in roll-off does not occur, and thus the current driving performance can be increased.

Furthermore, an effect to further facilitate control of the growing direction of the SiGe mixed crystal layers is also obtained. When growing of the SiGe mixed crystal layers is performed at the relatively low temperature of approximately 400° C. to 550° C. with SiH$_4$ being the source gas, desorption of hydrogen on the growing surface determines the rate of the epitaxial growth. Further, on the <111> plane, desorption of hydrogen is slower as compared to the (001) plane, and there is a difference of several more times in the growing speed between these two types of planes. Therefore, when the SiGe mixed crystal layer is formed by the pressure-reduced CVD method using mixed gas including SiH$_4$, growth from the side surface (<111> plane) plane becomes very small as compared to growth from the bottom surface ((001) plane) of the trench 68. Thus, as compared to the first to fifth embodiments, it becomes possible to control the epitaxial growth from the bottom up much easier.

Note that instead of the SiGe mixed crystal layers 69c having the low Ge concentration, Si layers, which do not include Ge at all, may be used.

—Seventh Embodiment—

Figure 13A:
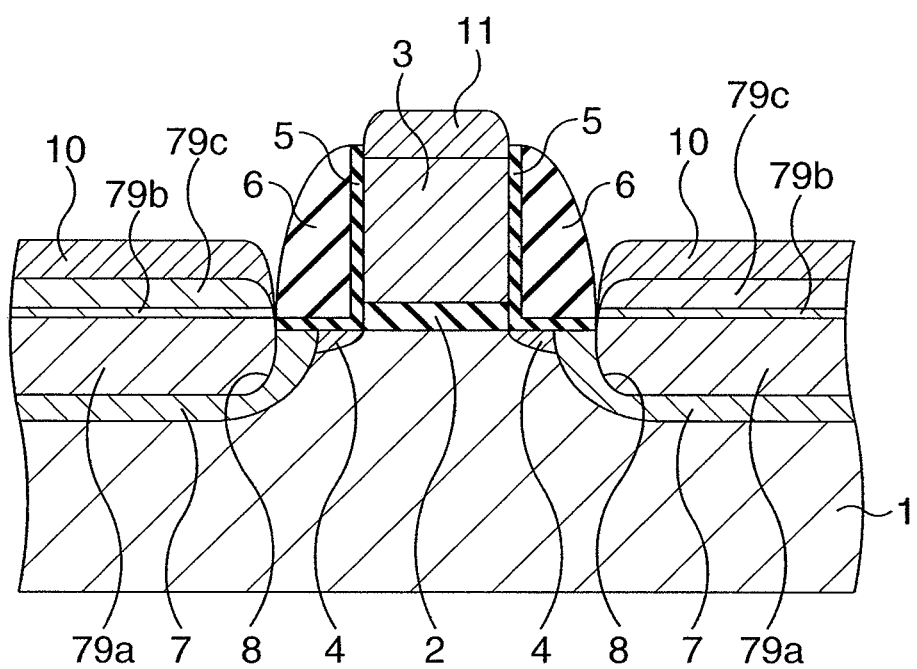
FIG. 13A is a cross-sectional view showing a method of manufacturing a semiconductor device according to a seventh embodiment of the present invention.

Next, a seventh embodiment of the present invention is explained. In the third embodiment, the SiGe mixed crystal layers 39b having the low Ge concentration are formed on the SiGe mixed crystal layers 39a having the high Ge concentration, but the speed of epitaxial growth of the SiGe mixed crystal layers decreases as the Ge concentration decreases. The seventh embodiment is a method for obtaining the same structure as the third embodiment in a shorter period of time. FIG. 13A is a cross-sectional view showing a method of manufacturing a semiconductor device according to the seventh embodiment of the present invention. Further, FIG. 13B is a timing chart showing changes in growing temperatures and Ge concentrations of SiGe mixed crystal layers in the seventh embodiment.

In the seventh embodiment, first, similarly to the first embodiment, processing until forming the trenches 8 is performed. Next, in each of the trenches 8, after a p-type SiGe mixed crystal layer 79a is formed by an epitaxial growth method, an SiGe mixed crystal layer 79b having a thickness of approximately 1 nm to 2 nm for example is formed thereon by an epitaxial growth method as shown in FIG. 13A. Subsequently, a SiGe mixed crystal layer 79c having a thickness of approximately 20 nm to 30 nm for example is formed on the SiGe mixed crystal layer 79b. Thereafter, similarly to the first embodiment, formation of the silicide layers 10 and 11, and so forth are performed.

Note that the height of an uppermost surface of the SiGe mixed crystal layer 79a from the bottom of the trench 8 is, similarly to the SiGe mixed crystal layer 39a of the third embodiment, higher than the depth of the trench 8 with the surface of the silicon substrate 1 being the standard. Further, a Ge concentration in the SiGe mixed crystal layer 79a is 20 atom % or higher for example, and Ge concentrations in the SiGe mixed crystal layers 79b and 79c are lower than 20 atom % for example. Furthermore, a growing temperature for the SiGe mixed crystal layer 79b is the same as or lower than a growing temperature for the SiGe mixed crystal layer 79a. Further, a growing temperature for the SiGe mixed crystal layer 79c is higher than the growing temperatures for both the SiGe mixed crystal layers 79a and 79b. For example, the growing temperatures for the SiGe mixed crystal layers 79a and 79b are approximately 400° C. to 550° C., and the growing temperature for the SiGe mixed crystal layer 79c is 500° C. to 700° C.

According to the seventh embodiment as described above, since the growing temperature for the SiGe mixed crystal layer 79c is higher than the growing temperatures for the SiGe mixed crystal layers 79a and 79b, decrease in growing speed along with decrease in the Ge concentrations can be compensated to thereby keep the productivity high. Note that when the SiGe mixed crystal layer 79c having the low Ge concentration is formed directly on the SiGe mixed crystal layer 79a at a high temperature, crystal lattices of the SiGe mixed crystal layers 79a and 79b become unstable, which may generate many defects. Such defects lead to increase in leak current and decrease in stress to the channel. However, in this embodiment, before forming the SiGe mixed crystal layer 79c, the SiGe mixed crystal layer 79b, which is thin and has the low Ge concentration, is formed on the SiGe mixed crystal layer 79a, so that the SiGe mixed crystal layer 79b operates as a buffer layer to prevent defects as described above from occurring.

Note that instead of the SiGe mixed crystal layers 79b and 79c having the low Ge concentration, two Si layers, which do not include Ge at all, may be used.

—Eighth Embodiment—

Figure 14:
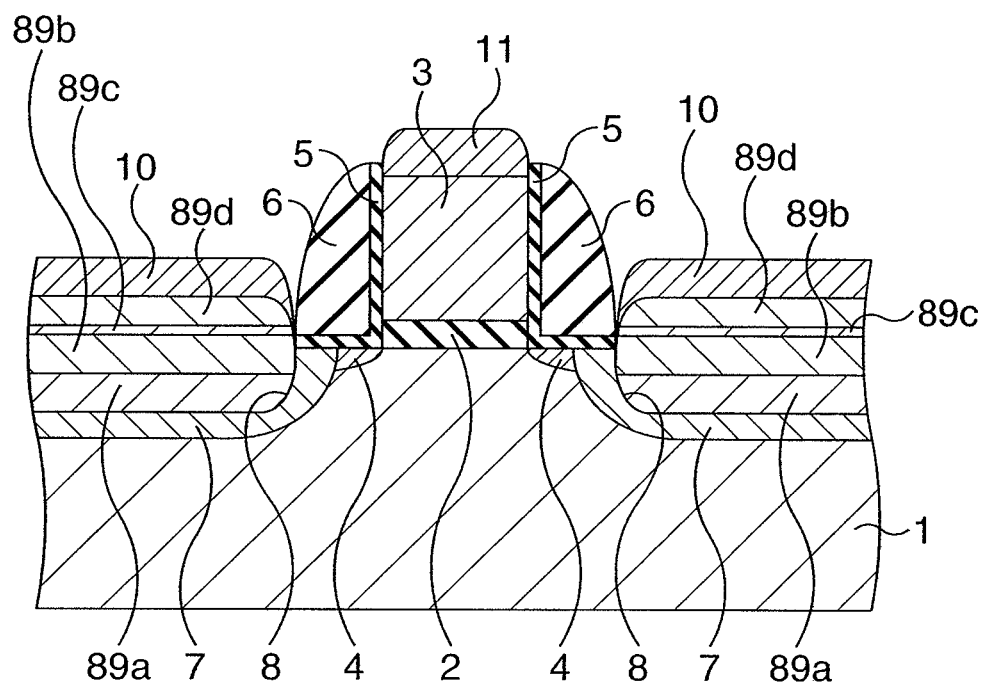
FIG. 14 is a cross-sectional view showing a method of manufacturing a semiconductor device according to an eighth embodiment of the present invention.

Next, an eighth embodiment of the present invention is explained. In the fourth embodiment, the SiGe mixed crystal layers 49c having the low Ge concentration are formed on the SiGe mixed crystal layers 49b having the high Ge concentration, but as described above, the speed of epitaxial growth of the SiGe mixed crystal layers decreases as the Ge concentration decreases. The eighth embodiment is a method for obtaining the same structure as the fourth embodiment in a shorter period of time. FIG. 14 is a cross-sectional view showing a method of manufacturing a semiconductor device according to the eighth embodiment of the present invention.

In the eighth embodiment, first, similarly to the first embodiment, processing until forming the trenches 8 is performed. Next, as shown in FIG. 14, a p-type SiGe mixed crystal layer 89a is formed by an epitaxial growth method in each of the trenches 8, and a p-type SiGe mixed crystal layer 89b is formed thereon by an epitaxial growth method. Furthermore, on the SiGe mixed crystal layer 89b, an SiGe mixed crystal layer 89c having a thickness of approximately 1 nm to 2 nm for example is formed by an epitaxial growth method, and an SiGe mixed crystal layer 89d having a thickness of approximately 20 nm to 30 nm for example is formed thereon by an epitaxial growth method. Thereafter, similarly to the first embodiment, formation of the silicide layers 10 and 11 and so forth are performed.

Note that the height of an uppermost surface of the SiGe mixed crystal layer 89a from the bottom of the trench 8 is, similarly to the SiGe mixed crystal layer 49a of the fourth embodiment, lower than the depth of the trench 8 with the surface of the silicon substrate 1 being the standard. Further, the height of an uppermost surface of the SiGe mixed crystal layer 89b from the bottom of the trench 8 is, similarly to the SiGe mixed crystal layer 49b of the fourth embodiment, higher than the depth of the trench 8 with the surface of the silicon substrate 1 being the standard. Further, a Ge concentration in the SiGe mixed crystal layer 89a is lower than 20 atom % for example, a Ge concentration in the SiGe mixed crystal layer 89b is 20 atom % or higher for example, and Ge concentrations in the SiGe mixed crystal layers 89c and 89d are lower than 20 atom % for example. Furthermore, a growing temperature for the SiGe mixed crystal layer 89c is the same as or lower than a growing temperature for the SiGe mixed crystal layer 89b. Further, a growing temperature for the SiGe mixed crystal layer 89d is higher than the growing temperatures for both the SiGe mixed crystal layers 89b and 89c. For example, the growing temperatures for the SiGe mixed crystal layers 89b and 89c are approximately 400° C. to 550° C., and the growing temperature for the SiGe mixed crystal layer 89d is 500° C. to 700° C.

According to the eighth embodiment as described above, the effect of the fourth embodiment and the effect of the seventh embodiment can be obtained simultaneously.

Note that instead of the SiGe mixed crystal layers 89c and 89d having the low Ge concentration, two Si layers, which do not include Ge at all, may be used.

Further, the method as in the seventh and eighth embodiments of forming SiGe mixed crystal layers having a low Ge concentration such that a second layer is formed at a high temperature after a first layer is formed to be thin at a low temperature is also effective in the fifth and sixth embodiments.

—Ninth Embodiment—

Next, a ninth embodiment of the present invention is described. FIG. 15A to FIG. 15G are cross-sectional views showing a method of manufacturing a semiconductor device according to the ninth embodiment of the present invention in the order of steps.

Figure 15A:
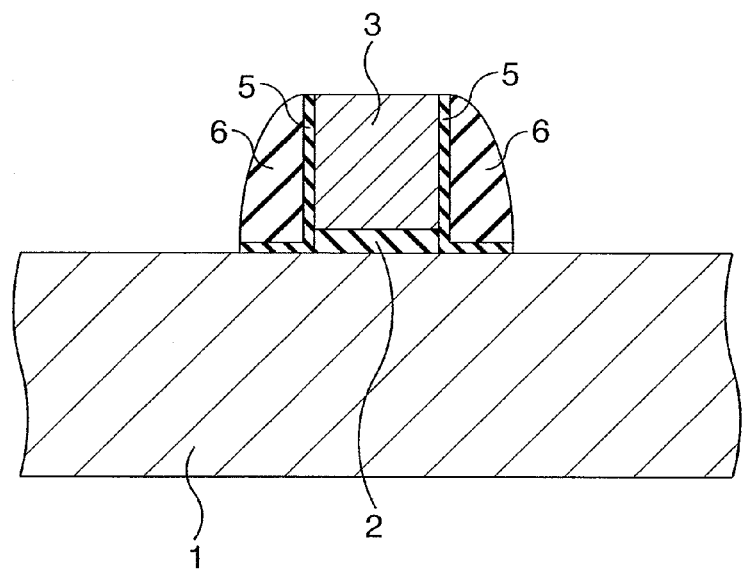
FIG. 15A to FIG. 15G are cross-sectional views showing a method of manufacturing a semiconductor device according to a ninth embodiment of the present invention in the order of steps.

In this embodiment, first, as shown in FIG. 15A, on an n-type silicon substrate 1 whose surface is a (001) plane for example, a gate insulating film 2 having a thickness of approximately 1.2 nm for example is formed. Next, on the gate insulating film 2, a gate electrode 3 constituted of polycrystalline silicon in which a p-type impurity is introduced is formed. Then, on the whole surface, an oxide film is formed by a CVD method, an insulating film is formed further, and they are etched back to thereby form a CVD oxide film 5 and a side wall insulating film 6. The CVD oxide film 5 each cover a part of the silicon substrate 1 and a side surface of the gate electrode 3.

Figure 15B:
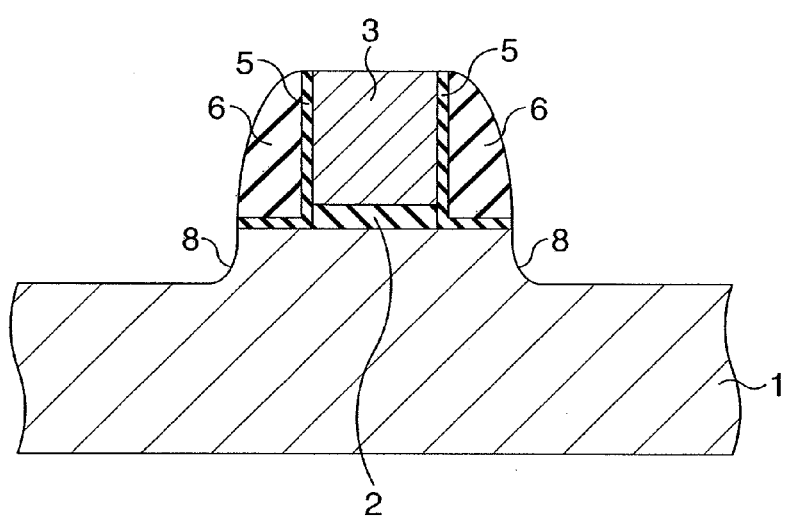

Thereafter, as shown in FIG. 15B, trenches 8 matching with the side wall insulating film 6 are formed.

Figure 15C:
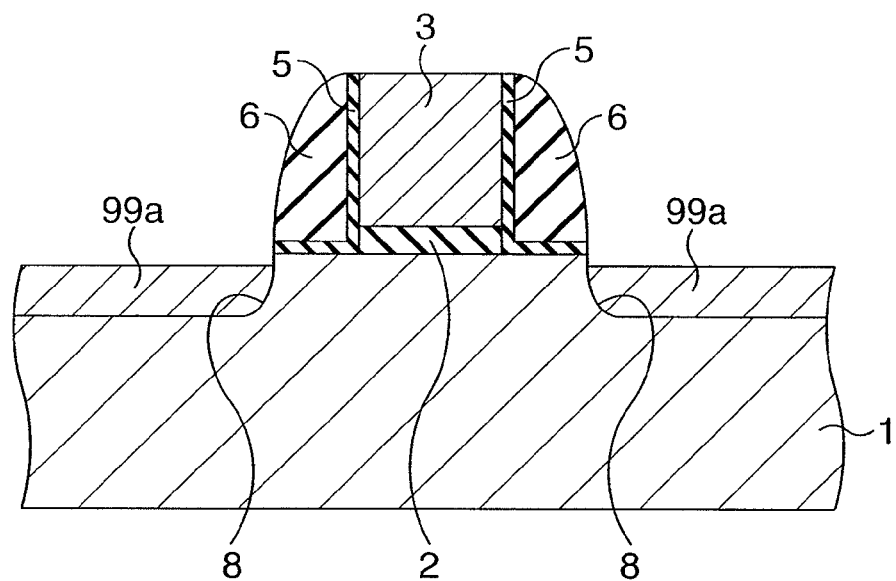

Subsequently, by an epitaxial growth method, as shown in FIG. 15C, a p-type SiGe mixed crystal layer 99a is formed in each of the trenches 8. At this time, the height of an uppermost surface of the SiGe mixed crystal layer 99a from the bottom of the trench 8 is made lower than the depth of the trench 8 with the surface of the silicon substrate 1 being the standard, similarly to the SiGe mixed crystal layer 19a in the first embodiment. Further, a Ge concentration in the SiGe mixed crystal layer 99a is lower than 20 atom % for example.

Figure 15D:
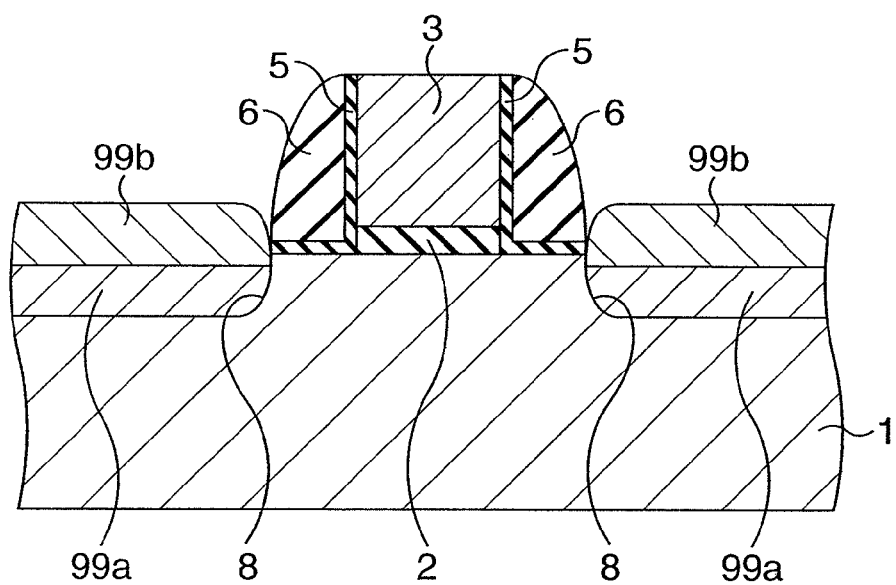

Next, by an epitaxial growth method, as shown in FIG. 15D, a p-type SiGe mixed crystal layer 99b is formed on the SiGe mixed crystal layer 99a. At this time, the height of an uppermost surface of the SiGe mixed crystal layer 99b from the bottom of the trench 8 is made higher than the depth of the trench 8 with the surface of the silicon substrate 1 being the standard, similarly to the SiGe mixed crystal layer 19b of the first embodiment. Further, a Ge concentration in the SiGe mixed crystal layer 99b is higher than 20 atom % for example.

Figure 15E:
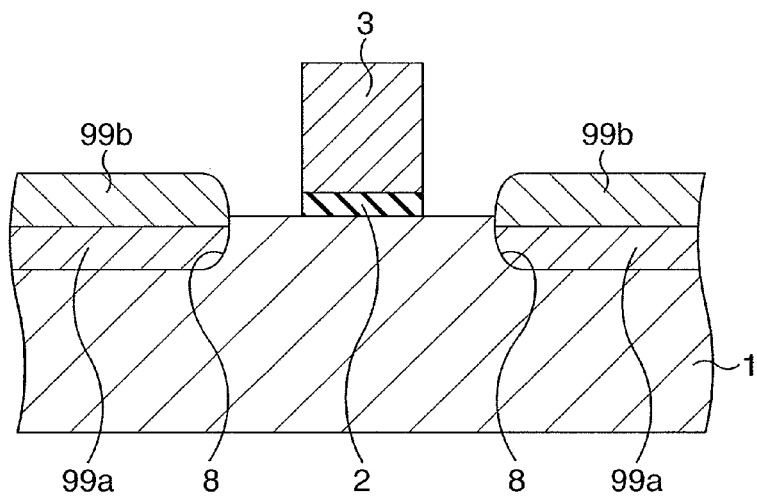

Next, by wet etching, as shown in FIG. 15E, the side wall insulating film 6 and the CVD oxide film 5 are removed. In this processing, for example a phosphoric acid solution, a hydrogen fluoride solution, or the like is used.

Figure 15F:
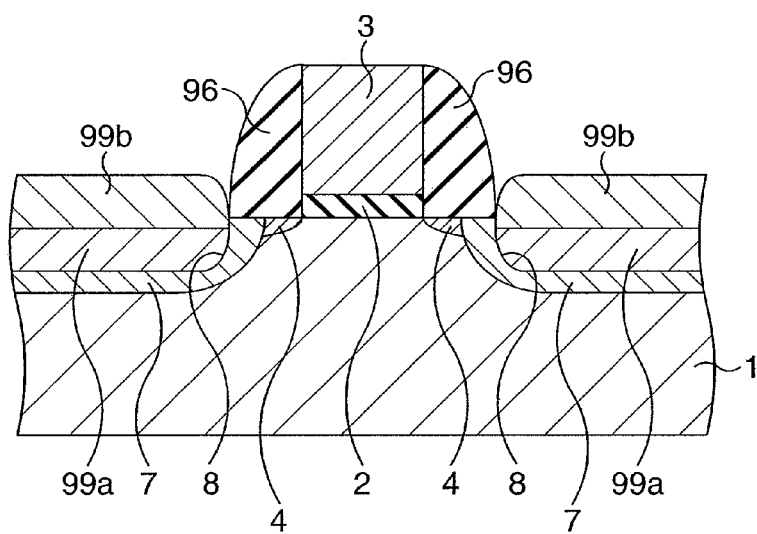

Next, as shown in FIG. 15F, with the gate electrode 3 being a mask, a p-type impurity is ion-implanted to thereby form impurity diffused layers 4 in the surface of the silicon substrate 1 on both sides of the gate electrode 3 respectively. Subsequently, on the whole surface, an oxide film is formed by a CVD method and etched back to thereby form a side wall insulating film 96. Next, with the gate electrode 3 and the side wall insulating film 96 being a mask, a p-type impurity is ion-implanted to thereby form high-concentration impurity diffused layers 7 which overlap parts of the impurity diffused layers 4 respectively.

Figure 15G:
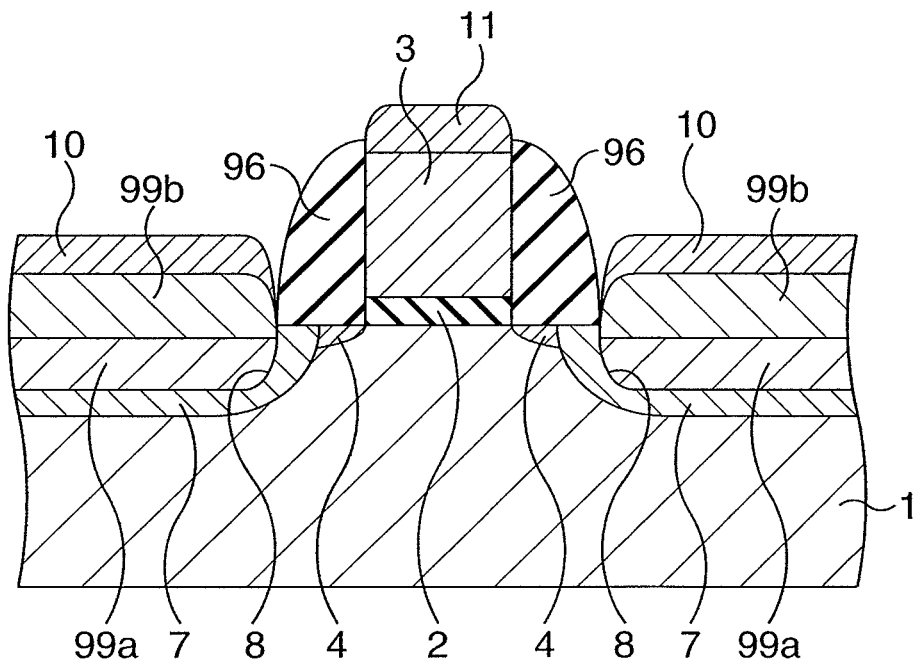

Next, as shown in FIG. 15G, a Ni layer or the like is formed on the entire surface and thermal treatment is performed to thereby form silicide layers 10 on the SiGe mixed crystal layers 99b respectively, and also form a silicide layer 11 on the gate electrode 3. Thereafter, an interlayer insulating film, a wiring and so forth are formed to complete the semiconductor device.

In the ninth embodiment as described above, since the impurity diffused layers 4 and 7 are formed after the SiGe mixed crystal layers 99a and 99b are formed, unnecessary diffusion of impurity does not occur when the SiGe mixed crystal layers 99a and 99b are formed. Therefore, even when the growing temperature for the SiGe mixed crystal layers 99a and 99b is set higher than that in the first embodiment, decrease in performance accompanying the diffusion of impurity does not occur. Such decrease in performance becomes significant as the gate length becomes short. For example, while the growing temperature for the SiGe mixed crystal layers 19a and 19b is approximately 400° C. to 550° C. in the first embodiment, the growing temperature for the SiGe mixed crystal layers 99a and 99b can be approximately 500° C. to 800° C. in the ninth embodiment.

—Tenth Embodiment—

Figure 16:
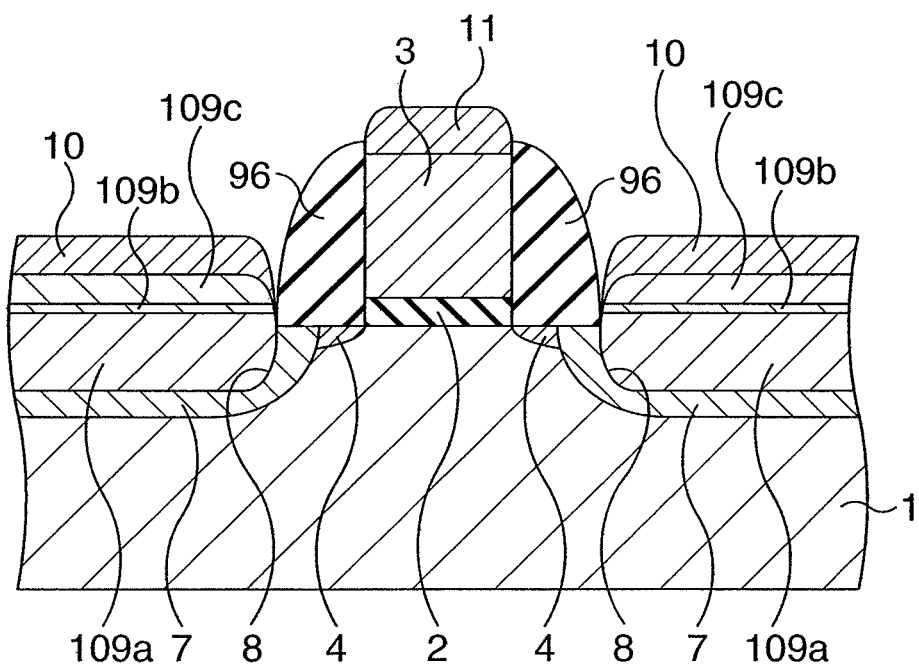
FIG. 16 is a cross-sectional view showing a method of manufacturing a semiconductor device according to a tenth embodiment of the present invention.

Next, a tenth embodiment of the present invention is explained. The tenth embodiment is a method of applying the sequence of the ninth embodiment to the seventh embodiment. FIG. 16 is a cross-sectional view showing a method of manufacturing a semiconductor device according to the tenth embodiment of the present invention.

In the tenth embodiment, first, similarly to the ninth embodiment, processing until forming the trenches 8 is performed. Next, a p-type SiGe mixed crystal layer 109a is formed by an epitaxial growth method in each of the trenches 8, and a SiGe mixed crystal layer 109b having a thickness of approximately 1 nm to 2 nm for example is formed thereon by an epitaxial growth method as shown in FIG. 16. Subsequently, a SiGe mixed crystal layer 109c having a thickness of approximately 20 nm to 30 nm for example is formed on the SiGe mixed crystal layer 109b. Thereafter, similarly to the ninth embodiment, formation of low-concentration impurity diffused layers 4, a side wall insulating film 96 and high-concentration impurity diffused layers 5, and so forth are performed.

Note that the height of an uppermost surface of the SiGe mixed crystal layer 109a from the bottom of the trench 8 is, similarly to the SiGe mixed crystal layer 79a of the seventh embodiment, higher than the depth of the trench 8 with the surface of the silicon substrate 1 being the standard. Further, a Ge concentration in the SiGe mixed crystal layer 109a is 20 atom % or higher for example, and Ge concentrations in the SiGe mixed crystal layers 109b and 109c are lower than 20 atom % for example. Furthermore, a growing temperature for the SiGe mixed crystal layer 109b is the same as or lower than a growing temperature for the SiGe mixed crystal layer 109a. Further, a growing temperature for the SiGe mixed crystal layer 109c is higher than the growing temperatures for both the SiGe mixed crystal layers 109a and 109b. For example, the growing temperatures for the SiGe mixed crystal layers 109a and 109b are approximately 500° C. to 800° C., and the growing temperature for the SiGe mixed crystal layer 109c is 600° C. to 850° C.

According to the tenth embodiment as described above, the effect of the seventh embodiment and the effect of the ninth embodiment can be obtained simultaneously.

Note that instead of the SiGe mixed crystal layers 109b and 109c having the low Ge concentration, two Si layers, which do not include Ge at all, may be used.

—Eleventh Embodiment—

Figure 17:
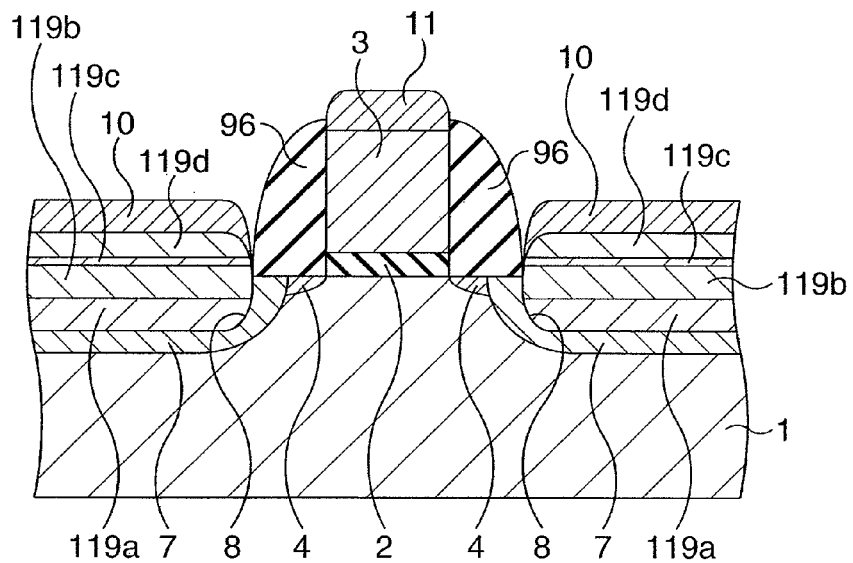
FIG. 17 is a cross-sectional view showing a method of manufacturing a semiconductor device according to an eleventh embodiment of the present invention.
Figure 18:
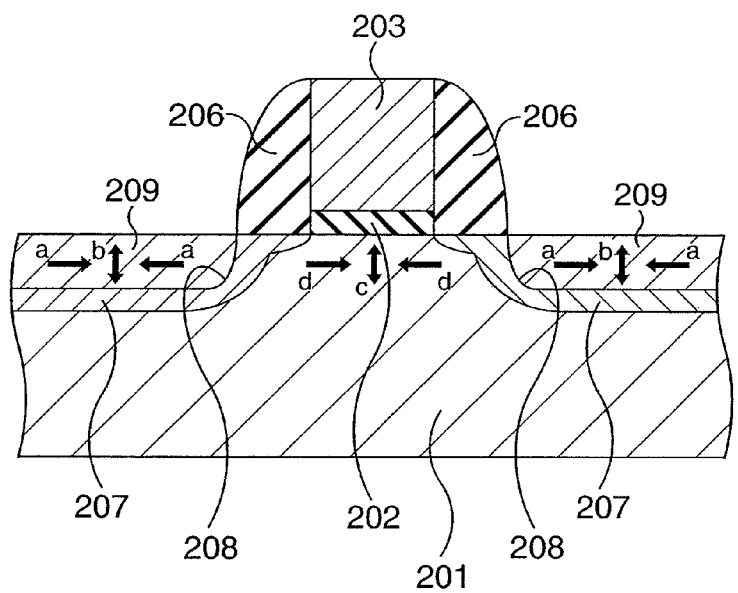
FIG. 18 is a cross-sectional view showing the structure of a conventional strained silicon transistor.

Next, an eleventh embodiment of the present invention is explained. The eleventh embodiment is a method of applying the sequence of the ninth embodiment to the eighth embodiment. FIG. 17 is a cross-sectional view showing a method of manufacturing a semiconductor device according to the eleventh embodiment of the present invention.

In the eleventh embodiment, first, similarly to the ninth embodiment, processing until forming the trenches 8 is performed. Next, as shown in FIG. 17, a p-type SiGe mixed crystal layer 119a is formed by an epitaxial growth method in each of the trenches 8, and a p-type SiGe mixed crystal layer 119b is formed thereon by an epitaxial growth method. Furthermore, on the SiGe mixed crystal layer 119b, an SiGe mixed crystal layer 119c having a thickness of approximately 1 nm to 2 nm for example is formed by an epitaxial growth method, and an SiGe mixed crystal layer 119d having a thickness of approximately 20 nm to 30 nm for example is formed thereon by an epitaxial growth method. Thereafter, similarly to the ninth embodiment, formation of low-concentration impurity diffused layers 4, a side wall insulating film 96 and high-concentration impurity diffused layers 5, and so forth are performed.

Note that the height of an uppermost surface of the SiGe mixed crystal layer 119a from the bottom of the trench 8 is, similarly to the SiGe mixed crystal layer 89a of the eighth embodiment, lower than the depth of the trench 8 with the surface of the silicon substrate 1 being the standard. Further, the height of an uppermost surface of the SiGe mixed crystal layer 119b from the bottom of the trench 8 is, similarly to the SiGe mixed crystal layer 89b of the eighth embodiment, higher than the depth of the trench 8 with the surface of the silicon substrate 1 being the standard. Further, a Ge concentration in the SiGe mixed crystal layer 119a is lower than 20 atom % for example, a Ge concentration in the SiGe mixed crystal layer 119b is 20 atom % or higher for example, and Ge concentrations in the SiGe mixed crystal layers 119c and 119d are lower than 20 atom % for example. Furthermore, a growing temperature for the SiGe mixed crystal layer 119c is the same as or lower than a growing temperature for the SiGe mixed crystal layer 119b. Further, a growing temperature for the SiGe mixed crystal layer 119d is higher than the growing temperatures for both the SiGe mixed crystal layers 119b and 119c. For example, the growing temperatures for the SiGe mixed crystal layers 119b and 119c are approximately 500° C. to 800° C., and the growing temperature for the SiGe mixed crystal layer 119d is 600° C. to 850° C.

According to the eleventh embodiment as described above, the effect of the eighth embodiment and the effect of the ninth embodiment can be obtained simultaneously.

Note that instead of the SiGe mixed crystal layers 119c and 119d having the low Ge concentration, two Si layers, which do not include Ge at all, may be used.

Further, the methods in the ninth to eleventh embodiment of forming impurity diffused layers after semiconductor layers are formed are also effective for the second to sixth embodiments.

Note that the Ge concentration in the SiGe mixed crystal layer is preferably 40 atom % or lower in high-strain layers (the SiGe mixed crystal layers 19b, 39a, and the like). This is because when the Ge concentration exceeds 40 atom %, the critical film thickness becomes approximately 20 nm or smaller at a growing temperature of approximately 400° C. to 550° C., which allows occurrence of dislocation easily.

Further, the embodiments up to this point are explained only for a p-channel MOS transistor, but it is preferable that also an n-channel MOS transistor is formed in an element active region separated and insulated from a p-channel MOS transistor by an element isolation region while the p-channel MOS transistor is formed.

Further, as the n-channel MOS transistor, it is also possible to form a strained silicon transistor. In this case, a Si layer in which carbon (c) is introduced may be formed in a trench for example. Since the lattice constant of C is lower than that of Si, stress and strain in reverse direction to those in the case of forming the SiGe layers are generated. Further, in the n-channel MOS transistor, its carriers are electrons. Therefore, similarly to the p-channel MOS transistor, the degree of movement of carriers improves. Then, by adopting the same structure and/or method of manufacturing as in the first to sixth embodiments in such an n-channel MOS transistor with respect to the p-channel transistor, much more favorable characteristics as compared to conventional arts can be obtained.

Note that when the n-channel MOS transistor is formed, it is preferable that the concentration of C is lower than 1 atom % in a low-strain layer (layer corresponding to the SiGe mixed crystal layers $19a$, $39b$, and the like). Further, in the high-strain layers (layers corresponding to the SiGe mixed crystal layers $19b$, $39a$, and the like), it is preferable that the concentration of C is 1 atom % or higher. Further, when the concentration of C exceeds 2 atom %, it becomes easy for C atoms to enter positions between the lattice of Si crystals, which can easily induce crystal defects. Accordingly, the concentration of C in the high-strain layer is preferably 2 atom % or lower. Furthermore, as the n-type impurity, for example phosphorous (P) or arsenic (As) can be used, the doping amount thereof being approximately $1\times10^{19}$ to $1\times10^{20}$ cm$^{-3}$ for example.

It should be noted that in FIG. 1 and FIG. 2 and relevant parts thereto in Japanese Patent Publication No. 2005-101278, there is disclosed formation of an Si film of 1 nm to 10 nm on an SiGe layer at the same time as formation of a film for a channel of another transistor when a transistor of an elevated source-drain structure is formed. However, this Si film is formed by coincidence merely because the aforementioned another transistor exists. Further, by just being a transistor of an elevated source-drain structure, it is not possible to generate a strain in a channel, and therefore the present invention is different therefrom in preconditions.

According to the present invention, a region of a semiconductor layer having a large difference in lattice constant from silicon is located within the same plane as an interface between the silicon substrate and the gate insulating film, so that the high degree of movement of carriers can be assured. Further, when there exists a region having a small difference in lattice constant below this region, crystal defects such as dislocation therein can be suppressed. Further, when there exists a region having a small difference in lattice constant between this region and the silicide layer, it is possible to suppress formation of a NiSi$_2$ phase. Therefore, favorable characteristics can be obtained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of manufacturing a semiconductor device, comprising:
    forming a gate insulating film on a silicon substrate;
    forming a gate electrode on the gate insulating film;
    performing ion-implantation into the silicon substrate using the gate electrode as a mask;
    forming a side wall insulating film on sidewall of the gate electrode;
    forming a trench in the silicon substrate using the gate electrode and the side wall insulating film as masks;
    forming a first crystal layer in the trench;
    forming a second crystal layer on the first crystal layer; and
    forming a silicide layer on the second crystal layer,
    wherein
        a top surface of the first crystal layer is located at the same height or higher than an interface between the silicon substrate and the gate insulating film, and
        the second crystal layer has a lattice constant closer to a lattice constant of silicon than a lattice constant of the first crystal layer.

2. A method of manufacturing a semiconductor device, comprising:
    forming a gate insulating film on a silicon substrate;
    forming a gate electrode on the gate insulating film;
    performing ion-implantation into the silicon substrate using the gate electrode as a mask;
    forming a side wall insulating film on sidewall of the gate electrode;
    forming a trench in the silicon substrate using the gate electrode and the side wall insulating film as masks;
    forming a first crystal layer in the trench;
    forming a second crystal layer on the first crystal layer; and
    forming a silicide layer on the second crystal layer,
    wherein
        a top surface of the first crystal layer is located at the same height or higher than an interface between the silicon substrate and the gate insulating film,
        the first crystal layer is constituted of silicon germanium having a first germanium concentration, and
        the second crystal layer is constituted of silicon germanium having a second germanium concentration which is lower than the first germanium concentration.

3. The method of manufacturing a semiconductor device according to claim 2, wherein
    the first germanium concentration is 20 atom % or higher, and the second germanium concentration is lower than 20 atom %.

4. The method of manufacturing a semiconductor device according to claim 2, wherein
    the first crystal layer is formed at a first growing temperature, and
    the second crystal layer is formed at a second growing temperature which is higher than the first growing temperature.

5. A method of manufacturing a semiconductor device, comprising:
    forming a gate insulating film on a silicon substrate;
    forming a gate electrode on the gate insulating film;
    performing ion-implantation into the silicon substrate using the gate electrode as a mask;
    forming a side wall insulating film on sidewall of the gate electrode;
    forming a trench in the silicon substrate using the gate electrode and the side wall insulating film as masks;
    forming a first crystal layer in the trench;
    forming a second crystal layer on the first crystal layer; and
    forming a silicide layer on the second crystal layer,
    wherein
        a top surface of the first crystal layer is located at the same height or lower than an interface between the silicon substrate and the gate insulating film, and the first crystal layer has a lattice constant closer to a lattice constant of silicon than a lattice constant of the second crystal layer.

6. A method of manufacturing a semiconductor device, comprising:
 forming a gate insulating film on a silicon substrate;
 forming a gate electrode on the gate insulating film; performing ion-implantation into the silicon substrate using the gate electrode as a mask;
 forming a trench in the silicon substrate;
 forming a first crystal layer in the trench;
 forming a second crystal layer on the first crystal layer; and
 forming a silicide layer on the second crystal layer,
 wherein
  a top surface of the first crystal layer is located at the same height or lower than an interface between the silicon substrate and the gate insulating film,
  the first crystal layer is constituted of silicon germanium having a first germanium concentration, and
  the second crystal layer is constituted of silicon germanium having a second germanium concentration which is higher than the first germanium concentration.

7. The method of manufacturing a semiconductor device according to claim 6, wherein
 the first germanium concentration is lower than 20 atom %, and the second germanium concentration is 20 atom % or higher.

8. The method of manufacturing a semiconductor device according to claim 6, wherein
 the first crystal layer is formed at a first growing temperature, and the second crystal layer is formed at a second growing temperature which is lower than the first growing temperature.

* * * * *